(12) United States Patent
Asano et al.

(10) Patent No.: US 8,535,871 B2
(45) Date of Patent: Sep. 17, 2013

(54) RADIATION-SENSITIVE RESIN COMPOSITION, METHOD FOR FORMING A RESIST PATTERN, COMPOUND, AND POLYMER

(75) Inventors: Yuusuke Asano, Tokyo (JP); Takanori Kawakami, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 13/325,056

(22) Filed: Dec. 14, 2011

(65) Prior Publication Data

US 2012/0156612 A1 Jun. 21, 2012

Related U.S. Application Data

(63) Continuation of application No. PCT/JP2010/060076, filed on Jun. 15, 2010.

(30) Foreign Application Priority Data

Jun. 15, 2009 (JP) .................................. 2009-142400

(51) Int. Cl.
*G03F 7/039* (2006.01)
*G03F 7/20* (2006.01)
*G03F 7/30* (2006.01)

(52) U.S. Cl.
USPC ........ 430/270.1; 430/907; 430/910; 430/326; 430/311; 526/242; 526/245; 560/220; 560/223

(58) Field of Classification Search
None
See application file for complete search history.

(56) References Cited

U.S. PATENT DOCUMENTS

| | | | |
|---|---|---|---|
| 5,744,537 A | 4/1998 | Brunsvold et al. | |
| 6,057,080 A | 5/2000 | Brunsvold et al. | |
| 2002/0022740 A1 | 2/2002 | Miyazawa et al. | |
| 2003/0008231 A1 | 1/2003 | Harada et al. | |
| 2003/0099901 A1 | 5/2003 | Hatakeyama et al. | |
| 2005/0277059 A1 | 12/2005 | Kanda et al. | |
| 2007/0218401 A1 | 9/2007 | Ando et al. | |
| 2008/0090172 A1 | 4/2008 | Hatakeyama et al. | |
| 2008/0193872 A1 | 8/2008 | Caporale et al. | |
| 2008/0305432 A1 | 12/2008 | Kanna | |
| 2010/0069590 A1 | 3/2010 | Utsumi et al. | |

FOREIGN PATENT DOCUMENTS

| | | |
|---|---|---|
| EP | 0159428 | 10/1985 |
| EP | 0233056 | 8/1987 |
| EP | 0264650 | 4/1988 |
| EP | 0298116 B1 | 11/1989 |
| JP | 06-12452 | 5/1984 |
| JP | 05-188598 | 7/1993 |
| JP | 2002-080431 | 3/2002 |
| JP | 2002-280202 | 9/2002 |
| JP | 2002-327013 | 11/2002 |
| JP | 2003-177539 | 6/2003 |
| JP | 2005-352384 | 12/2005 |
| JP | 2007-249192 | 9/2007 |
| JP | 2008-115203 | 5/2008 |
| JP | 2008-122932 | 5/2008 |
| JP | 2008-191644 | 8/2008 |
| JP | 2008-242271 | 10/2008 |
| WO | WO 2008/32716 | 3/2008 |

OTHER PUBLICATIONS

International Search Report for corresponding International Application No. PCT/JP2010/060076, Jul. 20, 2010.
Written Opinion for corresponding International Application No. PCT/JP2010/060076, Jul. 20, 2010.
Tadatomi Nishikubo et al., Convenient Syntheses of Cyclic Carbonates by New Reaction of Oxiranes with β-Butyrolactone, Tetrahedron Letters, 1986, p. 3741-p. 3744, vol. 27, No. 32.
Vincenzo Calo et al., Cyclic Carbonate Formation from Carbon Dioxide and Oxiranes in Tetrabutylammonium Halides as Solvents and Catalysts, Organic Letters, 2002, p. 2561-p. 2563, vol. 4, No. 15.
Korean Notice of Preliminary Rejection for corresponding KR Application No. 10-2011-7029913, Jul. 19, 2013.

*Primary Examiner* — Sin J. Lee
(74) *Attorney, Agent, or Firm* — Ditthavong Mori & Steiner, P.C.

(57) ABSTRACT

A radiation-sensitive resin composition includes a first polymer that includes a repeating unit having an acid-labile group and becomes alkali-soluble upon dissociation of the acid-labile group, and a radiation-sensitive acid-generating agent. The acid-labile group has a structure shown by a general formula (1). $R^1$ represents a methyl group or the like, $R^2$ represents a hydrocarbon group that forms a cyclic structure, $R^3$ represents a fluorine atom or the like, $R^4$ represents a carbon atom, and $n_1$ is an integer from 1 to 7.

8 Claims, No Drawings

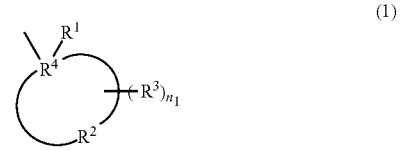

(1)

RADIATION-SENSITIVE RESIN COMPOSITION, METHOD FOR FORMING A RESIST PATTERN, COMPOUND, AND POLYMER

CROSS-REFERENCE TO RELATED APPLICATIONS

The present application is a continuation application of International Application No. PCT/JP2010/060076, filed Jun. 15, 2010, which claims priority to Japanese Patent Application No. 2009-142400, filed Jun. 15, 2009. The contents of these applications are incorporated herein by reference in their entirety.

BACKGROUND OF THE INVENTION

1. Field of the Invention

The invention relates to a radiation-sensitive resin composition, a method for forming a resist pattern, and a compound and a polymer.

2. Discussion of the Background

In the field of microfabrication used to produce an integrated circuit element, lithographic technology that enables microfabrication with a line width of 0.10 μm or less has been desired in order to achieve a higher degree of integration. However, since a conventional lithographic process has utilized near ultraviolet rays (e.g., i-line), it is very difficult to implement microfabrication with a line width of 0.10 μm or less (sub-quarter-micrometer microfabrication). Therefore, lithographic technology that utilizes radiation having a shorter wavelength has been developed in order to enable microfabrication with a line width of 0.10 μm or less. Examples of radiation having a shorter wavelength include a bright line spectrum of a mercury lamp, far-ultraviolet rays (e.g., excimer laser light), X-rays, electron beams, and the like. Among these, KrF excimer laser light (wavelength: 248 nm) and ArF excimer laser light (wavelength: 193 nm) have attracted attention.

Since the excimer laser light has attracted attention, a number of resist film materials used for excimer laser light have been proposed. For example, a composition (hereinafter may be referred to as "chemically-amplified resist") that includes a component having an acid-labile group and a component that generates an acid upon irradiation (hereinafter may be referred to as "exposure") (hereinafter may be referred to as "acid-generating agent"), and utilizes a chemical amplification effect obtained by these components has been proposed.

However, in the field of microfabrication, it has been desired to form a still finer resist pattern (e.g., a fine resist pattern having a line width of about 45 nm). Therefore, as a method capable of forming a still finer resist pattern, some methods such as shortening the wavelength of the light source of the exposure device, or increasing the numerical aperture (NA) of the lens are known. However, a new expensive exposure device is required so as to shorten the wavelength of the light source. In the case of increasing the numerical aperture of the lens, since the resolution and the depth of focus have a trade-off relationship, there is a problem that a decrease in depth of focus occurs even if the resolution can be increased.

So, in recent years, liquid immersion lithography has been known as lithographic technology that can solve such a problem. Liquid immersion lithography provides an immersion exposure liquid (e.g., purified water or fluorine-containing inert fluid) between the lens and the resist film (over the resist film) during exposure. According to this liquid immersion lithography, the exposure optical space which was conventionally filled with air or an inert gas (e.g., nitrogen) is filled with an immersion exposure liquid that has a refractive index (n) higher than that of air and the like. Therefore, the same effect as that achieved when shortening the wavelength of exposure light can be achieved even if in the case of using the conventional wavelength of exposure light. That is, there is an advantage that high resolution can be obtained without decreasing depth of focus.

According to above liquid immersion lithography, a resist pattern that exhibits high resolution and an excellent depth of focus can be inexpensively formed even if the lens provided in an existing device is used. A number of resist film materials (radiation-sensitive resin compositions) used for liquid immersion lithography that utilize such as a fluorine-containing compound as a raw material in order to improve the water repellency of the resist film have been proposed (see JP-A-2008-115203, for example). It has been proposed to use a fluorine-containing compound as a raw material for a radiation-sensitive resin composition (see JP-A-2002-327013, JP-A-2002-080431 and JP-A-2002-280202, for example).

SUMMARY OF THE INVENTION

According to one aspect of the present invention, a radiation-sensitive resin composition includes a first polymer which includes a repeating unit having an acid-labile group and which becomes alkali-soluble upon dissociation of the acid-labile group, and a radiation-sensitive acid-generating agent. The acid-labile group has a structure shown by a general formula (1).

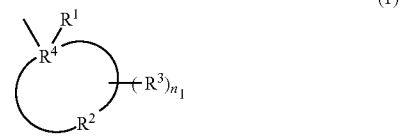

(1)

$R^1$ represents a monovalent hydrocarbon group having 1 to 5 carbon atoms, $R^2$ represents a divalent hydrocarbon group that is bonded to $R^4$ to form a cyclic structure, $R^3$ represents a fluorine atom or a monovalent hydrocarbon group having 1 to 10 carbon atoms that is at least partially substituted with a fluorine atom, each $R^3$ is either a same or different to each other when a plurality of $R^3$ are present and the structure shown by the general formula (1) includes 7 or less fluorine atoms in total, $R^4$ represents a carbon atom, $n_1$ is an integer from 1 to 7, and a fluorine atom is not bonded to a carbon atom of the divalent hydrocarbon group represented by $R^2$ that is adjacent to the carbon atom represented by $R^4$.

According to another aspect of the present invention, a method for forming a resist pattern includes forming a resist film on a substrate using the radiation-sensitive resin composition. The resist film is exposed via an immersion liquid provided over the resist film. The exposed resist film is developed to form a resist pattern.

According to further aspect of the present invention, a compound is shown by a general formula (2).

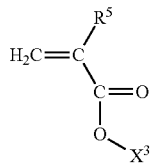
(2)

$R^5$ represents a hydrogen atom, a methyl group, or a trifluoromethyl group, and $X^3$ represents a structure shown by a general formula (1).

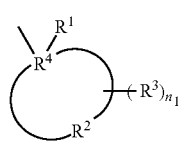
(1)

$R^1$ represents a monovalent hydrocarbon group having 1 to 5 carbon atoms, $R^2$ represents a divalent hydrocarbon group that is bonded to $R^4$ to form a cyclic structure, $R^3$ represents a fluorine atom or a monovalent hydrocarbon group having 1 to 10 carbon atoms that is at least partially substituted with a fluorine atom, each $R^3$ is either a same or different to each other when a plurality of $R^3$ are present and the structure shown by the general formula (1) includes 7 or less fluorine atoms in total, $R^4$ represents a carbon atom, $n_1$ is an integer from 1 to 7, and a fluorine atom is not bonded to a carbon atom of the divalent hydrocarbon group represented by $R^2$ that is adjacent to the carbon atom represented by $R^4$.

According to further aspect of the present invention, a compound is shown by a general formula (2-1).

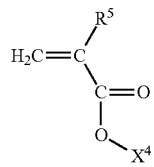
(2-1)

$R^5$ represents a hydrogen atom, a methyl group, or a trifluoromethyl group, and $X^4$ represents a structure shown by a general formula (1-1).

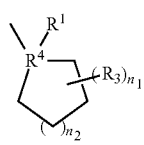
(1-1)

$R^1$ represents a monovalent hydrocarbon group having 1 to 5 carbon atoms, $R^3$ represents a fluorine atom or a monovalent hydrocarbon group having 1 to 10 carbon atoms that is at least partially substituted with a fluorine atom, each $R^3$ is either a same or different to each other when a plurality of $R^3$ are present and the structure shown by the general formula (1-1) includes 7 or less fluorine atoms in total, $R^4$ represents a carbon atom, $n_1$ is an integer from 1 to 7, $n_2$ is an integer from 1 to 4, and a fluorine atom is not bonded to each carbon atom that is adjacent to the carbon atom represented by $R^4$.

According to further aspect of the present invention, a polymer includes a repeating unit derived from the compound.

DESCRIPTION OF THE EMBODIMENTS

The embodiments will now be described. The embodiment of the invention provides the following radiation-sensitive resin composition, method for forming a resist pattern, compound, and polymer.

[1] A radiation-sensitive resin composition including (A) a polymer that includes a repeating unit having an acid-labile group, and becomes alkali-soluble upon dissociation of the acid-labile group, and (B) a radiation-sensitive acid-generating agent, wherein the acid-labile group has a structure shown by a general formula (1),

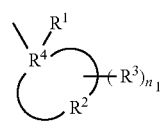
(1)

wherein $R^1$ represents a monovalent hydrocarbon group having 1 to 5 carbon atoms, $R^2$ represents a divalent hydrocarbon group that is bonded to $R^4$ to form a cyclic structure, $R^3$ represents a fluorine atom or a monovalent hydrocarbon group having 1 to 10 carbon atoms that is at least partially substituted with a fluorine atom, provided that a plurality of $R^3$ may be either the same or different when a plurality of $R^3$ are present, and the structure shown by the general formula (1) includes 7 or less fluorine atoms in total, $R^4$ represents a carbon atom, and $n_1$ is an integer from 1 to 7, provided that a fluorine atom is not bonded to a carbon atom of the divalent hydrocarbon group represented by $R^2$ that is adjacent to the carbon atom represented by $R^4$.

[2] The radiation-sensitive resin composition according to [1], wherein the acid-labile group has a structure shown by a general formula (1-1),

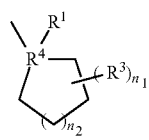
(1-1)

wherein $R^1$ represents a monovalent hydrocarbon group having 1 to 5 carbon atoms, $R^3$ represents a fluorine atom or a monovalent hydrocarbon group having 1 to 10 carbon atoms that is at least partially substituted with a fluorine atom, provided that a plurality of $R^3$ may be either the same or different when a plurality of $R^3$ are present, and the structure shown by the general formula (1-1) includes 7 or less fluorine atoms in total, $R^4$ represents a carbon atom, and $n_1$ is an integer from 1 to 7, and $n_2$ is an integer from 1 to 4, provided that a fluorine atom is not bonded to each carbon atom that is adjacent to the carbon atom represented by $R^4$.

[3] The radiation-sensitive resin composition according to [1], wherein the repeating unit having the acid-labile group is a repeating unit shown by a general formula (Ia),

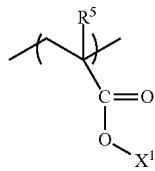

(Ia)

wherein $R^5$ represents a hydrogen atom, a methyl group, or a trifluoromethyl group, and $X^1$ represents the structure shown by the general formula (1).

[4] The radiation-sensitive resin composition according to [1], wherein the repeating unit having the acid-labile group is a repeating unit shown by a general formula (Ib),

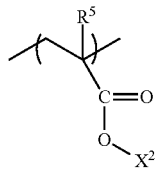

(Ib)

wherein $R^5$ represents a hydrogen atom, a methyl group, or a trifluoromethyl group, and $X^2$ represents the structure shown by the general formula (1-1).

[5] The radiation-sensitive resin composition according to any one of [1] to [4], further including (C) a polymer that includes a repeating unit having an acid-labile group, and differs from the polymer (A).

[6] The radiation-sensitive resin composition according to [5], wherein the amount of the polymer (A) is 0.1 to 20 parts by mass based on 100 parts by mass of the polymer (C).

[7] A method for forming a resist pattern including (1) a step of forming a resist film on a substrate using the radiation-sensitive resin composition according to any one of [1] to [6], (2) a step of exposing the resist film via an immersion exposure liquid provided over the resist film, and (3) a step of developing the exposed resist film to form a resist pattern.

[8] A compound shown by a general formula (2),

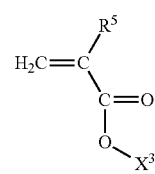

(2)

wherein $R^5$ represents a hydrogen atom, a methyl group, or a trifluoromethyl group, and $X^3$ represents a structure shown by a general formula (1),

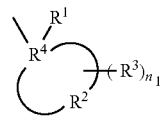

(1)

wherein $R^1$ represents a monovalent hydrocarbon group having 1 to 5 carbon atoms, $R^2$ represents a divalent hydrocarbon group that is bonded to $R^4$ to form a cyclic structure, $R^3$ represents a fluorine atom or a monovalent hydrocarbon group having 1 to 10 carbon atoms that is at least partially substituted with a fluorine atom, provided that a plurality of $R^3$ may be either the same or different when a plurality of $R^3$ are present, and the structure shown by the general formula (1) includes 7 or less fluorine atoms in total, $R^4$ represents a carbon atom, and $n_1$ is an integer from 1 to 7, provided that a fluorine atom is not bonded to a carbon atom of the divalent hydrocarbon group represented by $R^2$ that is adjacent to the carbon atom represented by $R^4$.

[9] A compound shown by a general formula (2-1),

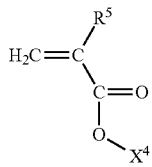

(2-1)

wherein $R^5$ represents a hydrogen atom, a methyl group, or a trifluoromethyl group, and $X^4$ represents a structure shown by a general formula (1-1),

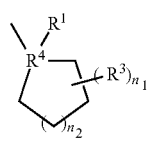

(1-1)

wherein $R^1$ represents a monovalent hydrocarbon group having 1 to 5 carbon atoms, $R^3$ represents a fluorine atom or a monovalent hydrocarbon group having 1 to 10 carbon atoms that is at least partially substituted with a fluorine atom, provided that a plurality of $R^3$ may be either the same or different when a plurality of $R^3$ are present, and the structure shown by the general formula (1-1) includes 7 or less fluorine atoms in total, $R^4$ represents a carbon atom, and $n_1$ is an integer from 1 to 7, and $n_2$ is an integer from 1 to 4, provided that a fluorine atom is not bonded to each carbon atom that is adjacent to the carbon atom represented by $R^4$.

[10] A polymer including a repeating unit derived from the compound according to [8] or [9].

The above radiation-sensitive resin composition may be used as a material for a resist film that has a high receding contact angle with an immersion exposure liquid (e.g., water), has an advancing contact angle and a receding contact angle in a well-balanced manner, and rarely produces development defects (particularly blob defects).

Since the above method for forming a resist pattern utilizes a resist film that has a high receding contact angle with an immersion exposure liquid (e.g., water), has an advancing contact angle and a receding contact angle in a well-balanced manner, and rarely produces development defects (particularly blob defects), an excellent resist pattern with a reduced number of defects can be formed.

The above compound may be used as a material for a polymer included in a radiation-sensitive resin composition that may be used as a material for a resist film that has a high receding contact angle with an immersion exposure liquid (e.g., water), has an advancing contact angle and a receding contact angle in a well-balanced manner, and rarely produces development defects (particularly blob defects).

The above polymer may be used as a material for a radiation-sensitive resin composition that can form a resist film that has a high receding contact angle with an immersion exposure liquid (e.g., water), has an advancing contact angle and a receding contact angle in a well-balanced manner, and rarely produces development defects (particularly blob defects).

Embodiments of the invention are described below. Note that the invention is not limited to the following embodiments. It should be understood that various modifications, improvements, and the like may be made of the following embodiments without departing from the scope of the invention based on common knowledge of a person skilled in the art.

[1] Radiation-Sensitive Resin Composition

A radiation-sensitive resin composition according to one embodiment of the invention includes (A) a polymer that includes a repeating unit having an acid-labile group, and becomes alkali-soluble upon dissociation of the acid-labile group (hereinafter may be referred to as "polymer (A)"), and (B) a radiation-sensitive acid-generating agent, wherein the acid-labile group has a structure shown by the following general formula (1). The radiation-sensitive resin composition may be used as a material for a resist film that has a high receding contact angle with an immersion exposure liquid (e.g., water) (i.e., exhibits high water repellency), and rarely produces development defects.

[1-1] Polymer (A)

The polymer (A) includes a repeating unit having an acid-labile group which has a structure shown by the general formula (1) (hereinafter may be referred to as "repeating unit (I)"), and becomes alkali-soluble upon dissociation of the acid-labile group. Specifically, the polymer (A) is insoluble or scarcely soluble in an alkali before the acid-labile group dissociates, but becomes alkali-soluble upon dissociation of the acid-labile group due to an acid. The expression "insoluble or scarcely soluble in an alkali" in this specification means that a film (thickness: 100 nm) that is formed only of the polymer (A) instead of the above radiation-sensitive resin composition has a thickness equal to or more than 50% of the initial thickness when developed under alkaline development conditions employed in the case of forming a resist pattern using a resist film that is formed of the above radiation-sensitive resin composition.

A radiation-sensitive resin composition that can form a resist film that has a high receding contact angle with an immersion exposure liquid (e.g., water) (i.e., exhibits high water repellency), and rarely produces development defects can be obtained by using the polymer (A). It is considered that the acid-labile group included in the polymer (A) exhibits high water repellency during exposure because it has a fluorine atom. The affinity to a developer is considered to be improved after exposure due to dissociation of the acid-labile group that has a fluorine atom, so that development defects can be reduced.

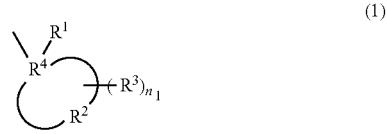

wherein $R^1$ represents a monovalent hydrocarbon group having 1 to 5 carbon atoms, $R^2$ represents a divalent hydrocarbon group that is bonded to $R^4$ to form a cyclic structure, $R^3$ represents a fluorine atom or a monovalent hydrocarbon group having 1 to 10 carbon atoms that is at least partially substituted with a fluorine atom, provided that a plurality of $R^3$ may be either the same or different when a plurality of $R^3$ are present, and the structure shown by the general formula (1) includes 7 or less fluorine atoms in total, $R^4$ represents a carbon atom, and $n_1$ is an integer from 1 to 7, provided that a fluorine atom is not bonded to a carbon atom of the divalent hydrocarbon group represented by $R^2$ that is adjacent to the carbon atom represented by $R^4$.

Note that the term "dynamic contact angle (advancing contact angle or receding contact angle)" in this specification refers to the angle formed by the surface of a water droplet and a resist film when dripping 25 µl of water onto a resist film formed using the radiation-sensitive resin composition to form a water droplet, and sucking or discharging the water droplet at a rate of 10 µl/min. The dynamic contact angle may be measured using a contact angle meter "DSA-10" (manufactured by KRUS).

[1-1-1] Repeating Unit (I)

$R^1$ in the general formula (1) represents a monovalent hydrocarbon group having 1 to 5 carbon atoms, and is preferably a methyl group, an ethyl group, an n-propyl group, an isopropyl group, an n-butyl group, an isobutyl group, or sec-butyl group. Among these, a methyl group, an ethyl group, and an isopropyl group are particularly preferable.

$R^2$ represents a divalent hydrocarbon group that is bonded to $R^4$ to form a cyclic structure. The cyclic structure formed by $R^2$ and $R^4$ may be either a monocyclic structure or a polycyclic structure. Specific examples of the cyclic structure formed by $R^2$ and $R^4$ include a group having a monocyclo, a bicyclo, a tricyclo, or a tetracyclo structure of 4 or more carbon atoms. The number of carbon atoms of the cyclic structure is preferably 4 to 30, and more preferably 5 to 20.

Examples of the divalent hydrocarbon group having a cyclic structure formed by $R^2$ and $R^4$ include divalent groups derived from adamantane, noradamantane, a decalin residue, tricyclodecane, tetracyclododecane, norbornane, cedrol, a group shown by the following general formula (1-2), cyclononane, cyclodecane, cyclododecane, and the like. Among these, the group shown by the following general formula (1-2) is preferable since an excellent pattern shape is obtained.

wherein $n_2$ is an integer from 1 to 4.

The divalent hydrocarbon group having a cyclic structure may be substituted with a substituent other than $R^1$ and $R^3$. Examples of the substituent include an alkyl group, a substituted alkyl group, a cycloalkyl group, an alkenyl group, an acyl group, a halogen atom (excluding a fluorine atom), a hydroxyl group, an alkoxy group, a carboxyl group, an alkoxycarbonyl group, and the like.

Examples of the alkyl group include a methyl group, an ethyl group, a propyl group, an isopropyl group, a butyl group, and the like. Examples of the substituent of the substituted alkyl group include a hydroxyl group, a halogen atom (excluding a fluorine atom), an alkoxy group, and the like. Examples of the cycloalkyl group include a cyclopropyl group, a cyclopentyl group, a cyclohexyl group, and the like. Examples of the alkenyl group include an alkenyl group having 2 to 6 carbon atoms. Specific examples of the alkenyl group include a vinyl group, a propenyl group, an allyl group, a butenyl group, a pentenyl group, a hexenyl group, and the like. Examples of the acyl group include an acetyl group, an ethylcarbonyl group, a propylcarbonyl group, and the like. Examples of the halogen atom include a chlorine atom, a bromine atom, an iodine atom, and the like. Examples of the alkoxy group (and the alkoxy group of the alkoxycarbonyl group) include an alkoxy group having 1 to 4 carbon atoms, such as a methoxy group, an ethoxy group, a propoxy group, and a butoxy group.

A fluorine atom is not bonded to the carbon atom of the hydrocarbon group represented by $R^2$ that is adjacent to the carbon atom represented by $R^4$. Dissociation due to an acid may not occur if a fluorine atom is bonded to the carbon atom that is adjacent to the carbon atom represented by $R^4$.

$R^3$ represents a fluorine atom or a monovalent hydrocarbon group having 1 to 10 carbon atoms that is at least partially substituted with a fluorine atom. When $R^3$ represents a monovalent hydrocarbon group, the monovalent hydrocarbon group may be linear, branched, or cyclic. $R^3$ is not particularly limited as long as meeting above conditions, and preferably represents a fluorine atom, a trifluoromethyl group, a pentafluoroethyl group, or a 1,1,1,3,3,3-hexafluoroisopropyl group since a resist film for which the advancing contact angle and the receding contact angle are well balanced can be formed.

$n_1$ is an integer from 1 to 7, and preferably an integer from 1 to 6. If $n_1$ is an integer equal to or larger than 8, the advancing contact angle and the receding contact angle of the resulting resist film may not be well balanced (i.e., it may be difficult to use the resist film for a high-speed scan) in the case of forming the resist firm.

The structure shown by the general formula (1) includes 7 or less (preferably 1 to 6) fluorine atoms in total. If the structure shown by the general formula (1) includes 8 or more fluorine atoms in total, the advancing contact angle and the receding contact angle of the resulting resist film may not be well balanced, so that bubble defects are likely to occur upon exposure in the case of forming the resist firm.

Examples of the alkali-soluble group protected by the acid-labile group having the structure shown by the general formula (1) include various groups known in the art. Specific examples of the alkali-soluble group include a carboxylic acid group, a sulfonic acid group, a phenol group, a thiol group, a group shown by the following formula, and the like. Among these, a carboxylic acid group and a sulfonic acid group are preferable.

The acid-labile group included in the polymer (A) preferably has a structure shown by the following general formula (1-1). A radiation-sensitive resin composition that can form a resist film that has a sufficiently high receding contact angle with an immersion exposure liquid (e.g., water) (i.e., exhibits excellent water repellency), and rarely produces development defects can be obtained by using a polymer having an acid-labile group which has such a structure. This is considered to be attributed to the efficient progress of the dissociation of the acid-labile group.

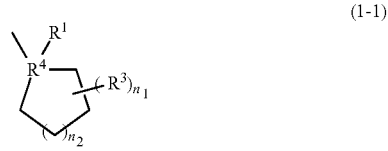

(1-1)

wherein $R^1$ represents a monovalent hydrocarbon group having 1 to 5 carbon atoms, $R^3$ represents a fluorine atom or a monovalent hydrocarbon group having 1 to 10 carbon atoms that is at least partially substituted with a fluorine atom, provided that a plurality of $R^3$ may be either the same or different when a plurality of $R^3$ are present, and the structure shown by the general formula (1-1) includes 7 or less fluorine atoms in total, $R^4$ represents a carbon atom, $n_1$ is an integer from 1 to 7, and $n_2$ is an integer from 1 to 4, provided that a fluorine atom is not bonded to each carbon atom that is adjacent to the carbon atom represented by $R^4$.

Specific examples of the repeating unit (I) include a repeating unit shown by the following general formula (Ia), and the like.

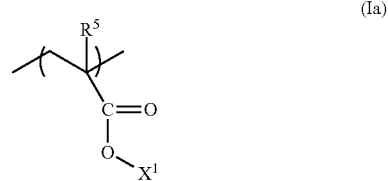

(Ia)

wherein $R^5$ represents a hydrogen atom, a methyl group, or a trifluoromethyl group, and $X^1$ represents the structure shown by the general formula (1).

Among the repeating unit shown by the general formula (Ia), a repeating unit shown by the following general formula (Ib) is preferable.

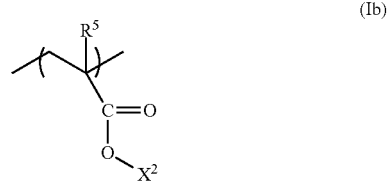

(Ib)

wherein $R^5$ represents a hydrogen atom, a methyl group, or a trifluoromethyl group, and $X^2$ represents the structure shown by the general formula (1-1).

The content ratio of the repeating unit (I) in the polymer (A) is preferably 5 to 100 mass %, more preferably 10 to 100 mass %, and particularly preferably 15 to 100 mass %, based on the total repeating units included in the polymer (A). If the content ratio of the repeating unit (I) is within the above range, a polymer that exhibits moderate water repellency, and rarely produces development defects can be obtained.

[1-1-2] Other Repeating Unit

The polymer (A) may include other repeating unit such as a repeating unit having an acid-labile group (excluding an acid-labile group that has the structure shown by the general formula (1)) (hereinafter may be referred to as "repeating unit (II)"), a repeating unit having an alkali-soluble group (hereinafter may be referred to as "repeating unit (III)"), or a repeating unit having an alkali-reactive group (hereinafter may be referred to as "repeating unit (IV)").

[1-1-2a] Repeating Unit (II)

When the polymer (A) includes the repeating unit having an acid-labile group (repeating unit (II)), the difference between the advancing contact angle and the receding contact angle of the resulting resist film can be reduced, and the scan speed during exposure can be increased. The repeating unit (II) is not particularly limited as long as having an acid-labile group, and is preferably a repeating unit shown by the following general formula (3) so that the scan speed during exposure can be further increased.

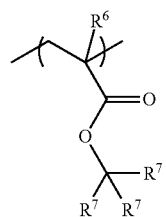

(3)

wherein $R^6$ represents a hydrogen atom, a methyl group, or a trifluoromethyl group, and $R^7$ individually represent a linear or branched alkyl group having 1 to 4 carbon atoms, a monovalent alicyclic hydrocarbon group having 4 to 20 carbon atoms, or a group derived therefrom, or two of $R^7$ bond to form a divalent alicyclic hydrocarbon group having 4 to 20 carbon atoms, or a group derived therefrom, together with the carbon atom that is bonded to the two $R^7$, and the remaining $R^7$ represents a linear or branched alkyl group having 1 to 4 carbon atoms, a monovalent alicyclic hydrocarbon group having 4 to 20 carbon atoms, or a group derived therefrom.

Examples of the linear or branched alkyl group having 1 to 4 carbon atoms represented by $R^7$ in the general formula (3) include a methyl group, an ethyl group, an n-propyl group, an i-propyl group, an n-butyl group, a 2-methylpropyl group, a 1-methylpropyl group, a t-butyl group, and the like.

Examples of the monovalent alicyclic hydrocarbon group having 4 to 20 carbon atoms represented by $R^7$ include a group that includes an alicyclic ring derived from a cycloalkane such as norbornane, tricyclodecane, tetracyclododecane, adamantane, cyclobutane, cyclopentane, cyclohexane, cycloheptane, or cyclooctane, and the like.

Examples of a group derived from the alicyclic hydrocarbon group include a group obtained by substituting the monovalent alicyclic hydrocarbon group with at least one linear, branched, or cyclic alkyl group having 1 to 4 carbon atoms, such as a methyl group, an ethyl group, an n-propyl group, an i-propyl group, an n-butyl group, a 2-methylpropyl group, a 1-methylpropyl group, or a t-butyl group, and the like.

Among these, an alicyclic hydrocarbon group represented by $R^7$ preferably includes an alicyclic ring derived from norbornane, tricyclodecane, tetracyclododecane, adamantane, cyclopentane, or cyclohexane, a group obtained by substituting the alicyclic hydrocarbon group with any of the above alkyl groups, and the like.

Examples of the divalent alicyclic hydrocarbon group having 4 to 20 carbon atoms that is formed by two of $R^7$ together with the carbon atom that is bonded to the two $R^7$ (i.e., the carbon atom bonded to the oxygen atom) include monocyclic hydrocarbon groups such as a cyclobutylene group, a cyclopentylene group, a cyclohexylene group, and a cyclooctylene group, polycyclic hydrocarbon groups such as a norbornylane group, a tricyclodecanylene group, and a tetracyclodecanylene group, and bridged polycyclic hydrocarbon groups such as an adamantylene group.

Examples of a group derived from the divalent alicyclic hydrocarbon group formed by two of $R^7$ include a group obtained by substituting the divalent alicyclic hydrocarbon group with at least one linear, branched, or cyclic alkyl group having 1 to 4 carbon atoms, such as a methyl group, an ethyl group, an n-propyl group, an i-propyl group, an n-butyl group, a 2-methylpropyl group, a 1-methylpropyl group, or a t-butyl group, and the like. Among these, a cyclopentylene group, a cyclohexylene group, a group obtained by substituting a cyclopentylene group or a cyclohexylene group with any of the above alkyl groups, and the like are preferable.

Among the repeating unit shown by the general formula (3), a repeating unit shown by the following general formula (3-1) is preferable since the scan speed during exposure can be advantageously increased.

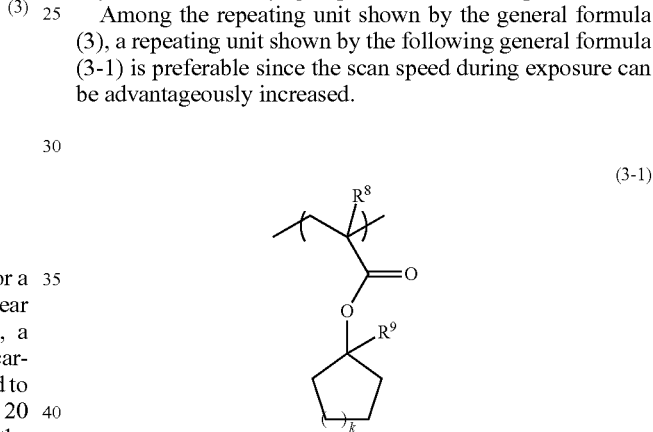

(3-1)

wherein $R^8$ represents a hydrogen atom, a methyl group, a trifluoromethyl group, or a hydroxymethyl group, $R^9$ represents a linear or branched alkyl group having 1 to 4 carbon atoms, and k is an integer from 1 to 4.

Specific examples of a monomer that produces the repeating unit shown by the general formula (3) include 2-methyladamant-2-yl(meth)acrylate,
2-methyl-3-hydroxyadamant-2-yl(meth)acrylate, 2-ethyladamant-2-yl(meth)acrylate,
2-ethyl-3-hydroxyadamant-2-yl(meth)acrylate, 2-n-propyladamant-2-yl(meth)acrylate,
2-isopropyladamant-2-yl(meth)acrylate, 2-methylbicyclo[2.2.1]hept-2-yl(meth)acrylate,
2-ethylbicyclo[2.2.1]hept-2-yl(meth)acrylate, 8-methyltricyclo[5.2.1.0$^{2,6}$]decan-8-yl(meth)acrylate,
8-ethyltricyclo[5.2.1.0$^{2,6}$]decan-8-yl(meth)acrylate,
4-methyltetracyclo[6.2.1$^{3,6}$.0$^{2,7}$]dodecan-4-yl(meth)acrylate,
4-ethyltetracyclo[6.2.1$^{3,6}$.0$^{2,7}$]dodecan-4-yl(meth)acrylate,
2-(bicyclo[2.2.1]hept-2-yl)-2-methylethyl(meth)acrylate,
2-(tricyclo[5.2.1.0$^{2,6}$]decan-8-yl)-2-methylethyl(meth)acrylate,
2-(tetracyclo[6.2.1$^{3,6}$.0$^{2,7}$]dodecan-4-yl)-2-methylethyl(meth)acrylate,
2-(adamantan-2-yl)-2-methylethyl(meth)acrylate, 2-(3-hydroxyadamantan-2-yl)-2-methylethyl(meth)acrylate, 1,2-dicyclohexylethyl(meth)acrylate,
1,2-di(bicyclo[2.2.1]hept-2-yl)ethyl(meth)acrylate,
1,2-di(tricyclo[5.2.1.0$^{2,6}$]decan-8-yl)ethyl(meth)acrylate,
1,2-di(tetracyclo[6.2.1$^{3,6}$.0$^{2,7}$]dodecan-4-yl)ethyl(meth)acrylate, 1,1-di(adamantan-1-yl)ethyl(meth)acrylate,
1-methyl-1-cyclopentyl(meth)acrylate, 1-ethyl-1-cyclopentyl(meth)acrylate,
1-isopropyl-1-cyclopentyl(meth)acrylate, 1-methyl-1-cyclohexyl(meth)acrylate,
1-ethyl-1-cyclohexyl(meth)acrylate, 1-ethyl-1-cyclooctyl(meth)acrylate, and the like.

Among these, since the monomers produce the repeating unit shown by the general formula (3-1), 1-methyl-1-cyclopentyl(meth)acrylate, 1-ethyl-1-cyclopentyl(meth)acrylate, 1-isopropyl-1-cyclopentyl(meth)acrylate, 1-methyl-1-cyclohexyl(meth)acrylate, 1-ethyl-1-cyclohexyl(meth)acrylate, and 1-ethyl-1-cyclooctyl(meth)acrylate) are preferable.

The polymer (A) may include only one type of the repeating unit (II), or may include two or more types of the repeating unit (II).

The content ratio of the repeating unit (II) in the polymer (A) is preferably 80 mol % or less, more preferably 20 to 80 mol %, and particularly preferably 30 to 70 mol %, based on the total repeating units (=100 mol %) included in the polymer (A). If the content ratio of the repeating unit (II) is within the above range, there is an advantage that the difference between the advancing contact angle and the receding contact angle can be reduced.

[1-1-2b] Repeating Unit (III)

When the polymer (A) includes the repeating unit having an alkali-soluble group (repeating unit (III)), there is an advantage that development defects can be further suppressed due to an improvement in affinity to a developer.

Examples of the alkali-soluble group included in the repeating unit (III) include functional groups having a pKa of 4 to 11, and the like. Among these, functional groups shown by the following general formulas (K-1) to (K-3) are preferable since the solubility of the resulting resist film in a developer is improved.

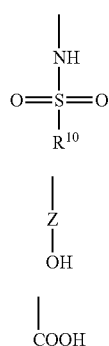

wherein $R^{10}$ represents a hydrocarbon group having 1 to 10 carbon atoms that is substituted with a fluorine atom, and Z represents a fluoromethylene group or an alkylene group having 2 to 10 carbon atoms that is substituted with a fluorine atom.

The hydrocarbon group having 1 to 10 carbon atoms that is substituted with a fluorine atom represented by $R^{10}$ in the general formula (K-1) is not particularly limited as long as the one obtained by substituting one or more hydrogen atoms of a hydrocarbon group having 1 to 10 carbon atoms with a fluorine atom, and is preferably a trifluoromethyl group or the like.

The alkylene group having 2 to 10 carbon atoms that is substituted with a fluorine atom represented by Z in the general formula (K-2) is not particularly limited as long as the one obtained by substituting one or more hydrogen atoms of an alkylene group having 2 to 10 carbon atoms with a fluorine atom, and is preferably a group shown by any of the following formulas (X-1) to (X-8). Among these, the group shown by the formula (X-1) is more preferable.

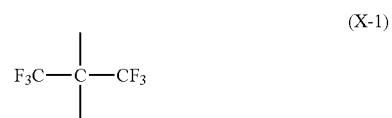

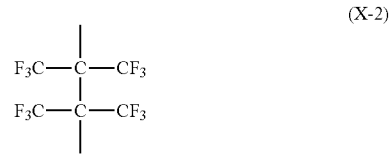

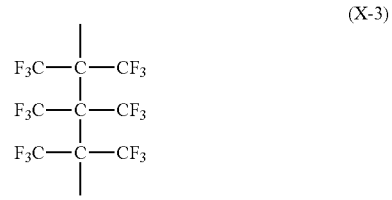

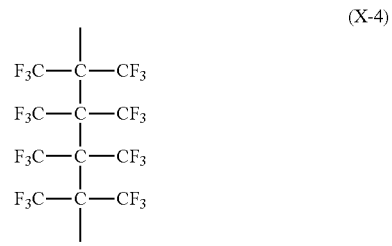

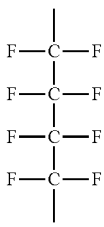

(X-8)

The main chain skeleton of the repeating unit (III) is not particularly limited, but is preferably a methacrylate skeleton, an acrylate skeleton, or an α-trifluoroacrylate skeleton.

Specific examples of the repeating unit (III) include repeating units derived from compounds shown by the following general formulas (4-1) to (4-3), and the like.

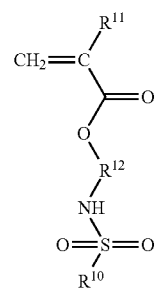

(4-1)

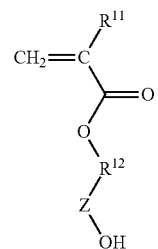

(4-2)

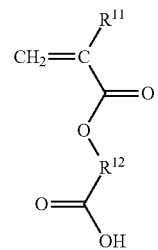

(4-3)

wherein $R^{11}$ represents a hydrogen atom, a methyl group, or a trifluoromethyl group, $R^{12}$ represents a single bond or a linear, branched, or cyclic saturated or unsaturated divalent hydrocarbon group having 1 to 20 carbon atoms, $R^{10}$ represents a hydrocarbon group having 1 to 10 carbon atoms that is substituted with a fluorine atom, and Z represents a fluoromethylene group or an alkylene group having 2 to 10 carbon atoms that is substituted with a fluorine atom.

Examples of the cyclic saturated or unsaturated hydrocarbon group represented by $R^{12}$ in the general formulas (4-1) to (4-3) include groups derived from an alicyclic hydrocarbon having 3 to 20 carbon atoms and groups derived from an aromatic hydrocarbon. Examples of the alicyclic hydrocarbon include cycloalkanes such as cyclobutane, cyclopentane, cyclohexane, bicyclo[2.2.1]heptane, bicyclo[2.2.2]octane, tricyclo[5.2.1.0$^{2,6}$]decane, tricyclo[3.3.1.1$^{3,7}$]decane, and tetracyclo[6.2.1.1$^{3,6}$.0$^{2,7}$]dodecane, and the like. Examples of the aromatic hydrocarbon include benzene, naphthalene, and the like.

The saturated or unsaturated hydrocarbon group may be a group obtained by substituting at least one hydrogen atom of the unsubstituted hydrocarbon group with at least one of a linear, branched, or cyclic alkyl group having 1 to 12 carbon atoms, such as a methyl group, an ethyl group, an n-propyl group, an i-propyl group, an n-butyl group, a 2-methylpropyl group, a 1-methylpropyl group, or a t-butyl group, a hydroxyl group, a cyano group, a hydroxyalkyl group having 1 to 10 carbon atoms, a carboxyl group, an oxygen atom, and the like.

Specific examples of the linear, branched, or cyclic saturated or unsaturated divalent hydrocarbon group having 1 to 20 carbon atoms represented by $R^{12}$ include the hydrocarbon groups shown by the following formulas (T-1) to (T-27), and the like. Note that "*" in the formulas (T-1) to (T-27) indicates a bonding site.

(T-1)

(T-2)

(T-3)

(T-4)

(T-5)

(T-6)

(T-7)

(T-8)

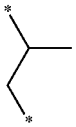

(T-9)

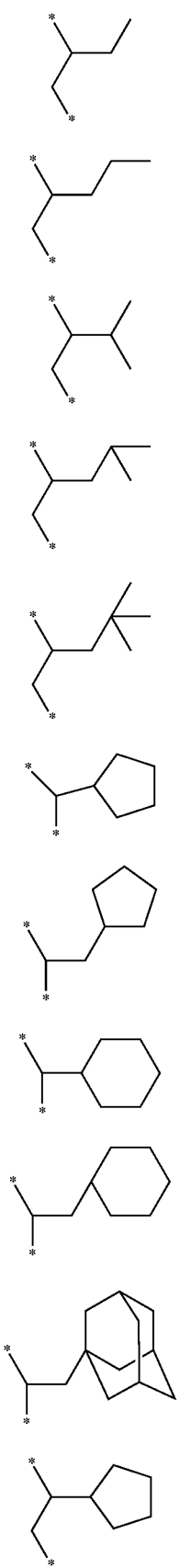
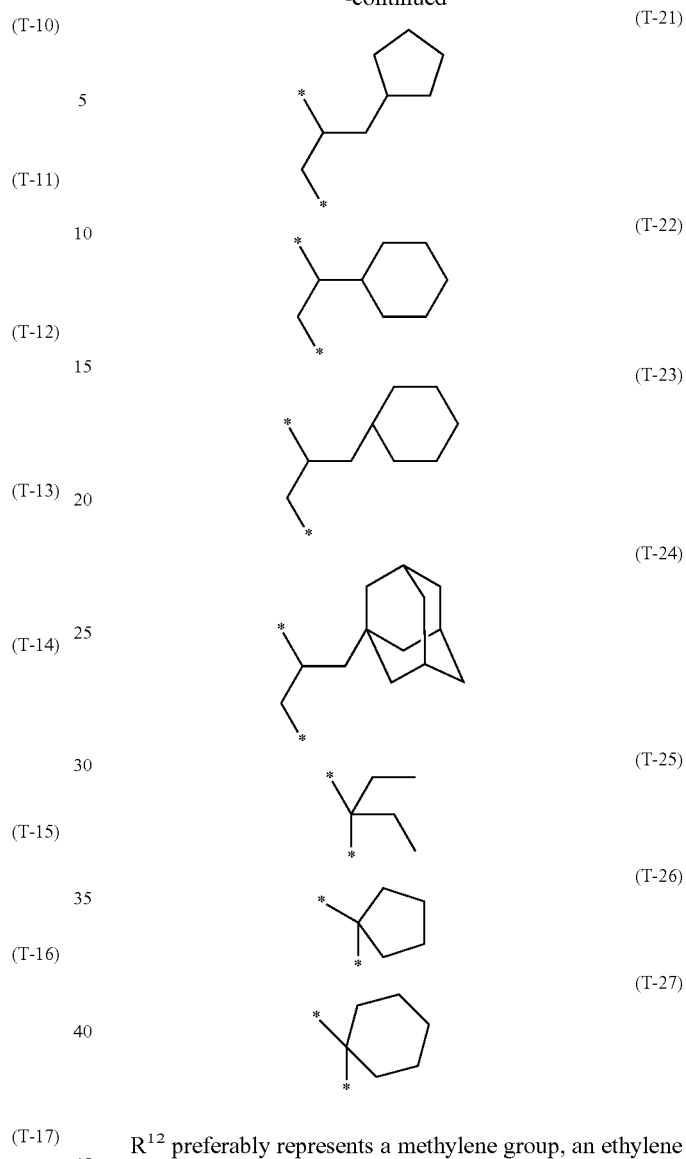

$R^{12}$ preferably represents a methylene group, an ethylene group, a 1-methylethylene group, a 2-methylethylene group, a divalent alicyclic hydrocarbon group having 4 to 20 carbon atoms, or a group derived therefrom.

The hydrocarbon group having 1 to 10 carbon atoms that is substituted with a fluorine atom represented by $R^{10}$ in the general formula (4-1) is not particularly limited as long as the one obtained by substituting one or more hydrogen atoms of a hydrocarbon group having 1 to 10 carbon atoms with a fluorine atom, and is preferably a trifluoromethyl group or the like.

The alkylene group having 2 to 10 carbon atoms that is substituted with a fluorine atom represented by Z in the general formula (4-2) is not particularly limited as long as the one obtained by substituting one or more hydrogen atoms of an alkylene group having 2 to 10 carbon atoms with a fluorine atom, and is preferably any of the groups shown by the formulas (X-1) to (X-8). Among these, the alkylene group shown by the formula (X-1) is more preferable.

The polymer (A) may include only one type of the repeating unit (III), or may include two or more types of the repeating unit (III).

The content ratio of the repeating unit (III) in the polymer (A) is preferably 50 mol % or less, more preferably 5 to 30 mol %, and particularly preferably 5 to 20 mol %, based on the total repeating units (=100 mol %) included in the polymer (A). If the content ratio of the repeating unit (III) is within the above range, the resulting resist film exhibits water repellency, and exhibits improved affinity to a developer after PEB.

[1-1-2c] Repeating Unit (IV)

When the polymer (A) includes the repeating unit having an alkali-reactive group (repeating unit (IV)), there is an advantage that the resulting resist film exhibits improved solubility in a developer.

The repeating unit (IV) is preferably a repeating unit having a lactone skeleton in the side chain or a repeating unit having a cyclic carbonate structure. The main chain skeleton of the repeating unit (IV) is not particularly limited, and is preferably a methacrylate skeleton, an acrylate skeleton, or an α-trifluoroacrylate skeleton.

Examples of the repeating unit having a lactone skeleton in the side chain include repeating units shown by the following general formulas (5-1) to (5-6), and the like.

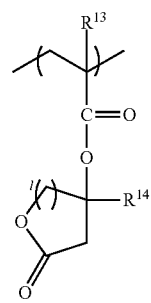
(5-1)

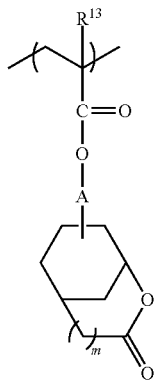
(5-2)

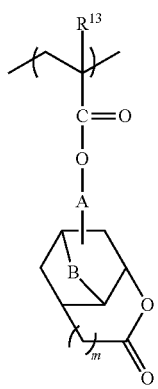
(5-3)

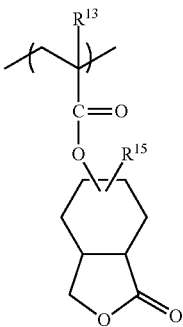
(5-4)

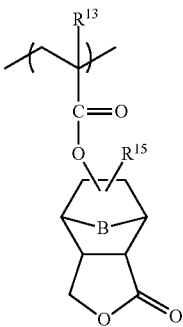
(5-5)

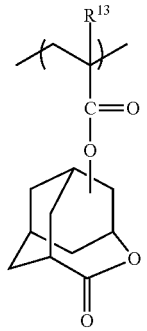
(5-6)

wherein $R^{13}$ represents a hydrogen atom or a methyl group, $R^{14}$ represents a hydrogen atom or a substituted or unsubstituted alkyl group having 1 to 4 carbon atoms, 1 is an integer from 1 to 3, $R^{15}$ represents a hydrogen atom or a methoxy group, A represents an ether group, an ester group, a carbonyl group, a divalent chain-like hydrocarbon group having 1 to 30 carbon atoms, a divalent alicyclic hydrocarbon group having 3 to 30 carbon atoms, a divalent aromatic hydrocarbon group having 6 to 30 carbon atoms, or a divalent group formed by combining arbitrary groups among these groups, m is 0 or 1, and B represents an oxygen atom or a methylene group.

Examples of the substituted or unsubstituted alkyl group having 1 to 4 carbon atoms represented by $R^{14}$ in the general formula (5-1) include a methyl group, an ethyl group, an n-propyl group, an i-propyl group, an n-butyl group, a 2-methylpropyl group, a 1-methylpropyl group, a t-butyl group, and the like. One or more hydrogen atoms of the alkyl group may be substituted with a substituent. Specific examples of the substituent include a halogen atom (e.g., fluorine atom, chlorine atom, and bromine atom), a phenyl group, an acetoxy group, an alkoxy group, and the like.

Examples of the divalent chain-like hydrocarbon group having 1 to 30 carbon atoms represented by A in the general formulas (5-2) and (5-3) include linear alkylene groups such as a methylene group, an ethylene group, a 1,2-propylene group, a 1,3-propylene group, a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, and an icosylene group; branched alkylene groups such as a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; and the like.

Examples of the divalent alicyclic hydrocarbon group having 3 to 30 carbon atoms represented by A in the general formulas (5-2) and (5-3) include monocyclic cycloalkylene groups having 3 to 30 carbon atoms, such as a 1,3-cyclobutylene group, a 1,3-cyclopentylene group, a 1,4-cyclohexylene group, and a 1,5-cyclooctylene group; polycyclic cycloalkylene groups such as a 1,4-norbornylene group, a 2,5-norbornylene group, a 1,5-admantylene group, and a 2,6-admantylene group; and the like.

Examples of the divalent aromatic hydrocarbon group having 6 to 30 carbon atoms represented by A in the general formulas (5-2) and (5-3) include arylene groups such as a phenylene group, a tolylene group, a naphthylene group, a phenanthrylene group, and an anthrylene group, and the like.

Specific examples of a monomer that produces the repeating unit having a lactone skeleton in the side chain include 5-oxo-4-oxa-tricyclo[4.2.1.0$^{3,7}$]non-2-yl(meth)acrylate, 9-methoxycarbonyl-5-oxo-4-oxa-tricyclo[4.2.1.0$^{3,7}$]non-2-yl(meth)acrylate, 5-oxo-4-oxa-tricyclo[5.2.1.0$^{3,8}$]dec-2-yl(meth)acrylate, (10-methoxycarbonyl-5-oxo-4-oxa-tricyclo[5.2.1.0$^{3,8}$]non-2-yl(meth)acrylate, 6-oxo-7-oxa-bicyclo[3.2.1]oct-2-yl(meth)acrylate, 4-methoxycarbonyl-6-oxo-7-oxa-bicyclo[3.2.1]oct-2-yl(meth)acrylate, 7-oxo-8-oxa-bicyclo[3.3.1]oct-2-yl(meth)acrylate, 4-methoxycarbonyl-7-oxo-8-oxa-bicyclo[3.3.1]oct-2-yl(meth)acrylate, 2-oxo-tetrahydropyran-4-yl(meth)acrylate, 4-methyl-2-oxo-tetrahydropyran-4-yl(meth)acrylate, 4-ethyl-2-oxo-tetrahydropyran-4-yl(meth)acrylate, 4-propyl-2-oxo-tetrahydropyran-4-yl(meth)acrylate, 5-oxo-tetrahydrofuran-3-yl(meth)acrylate, 2,2-dimethyl-5-oxo-tetrahydrofuran-3-yl(meth)acrylate, 4,4-dimethyl-5-oxo-tetrahydrofuran-3-yl(meth)acrylate, 2-oxo-tetrahydrofuran-3-yl(meth)acrylate, 4,4-dimethyl-2-oxo-tetrahydrofuran-3-yl(meth)acrylate, 5,5-dimethyl-2-oxo-tetrahydrofuran-3-yl(meth)acrylate, 2-oxo-tetrahydrofuran-3-yl(meth)acrylate, 5-oxo-tetrahydrofuran-2-yl-methyl(meth)acrylate, 3,3-dimethyl-5-oxo-tetrahydrofuran-2-yl-methyl(meth)acrylate, 4,4-dimethyl-5-oxo-tetrahydrofuran-2-yl-methyl(meth)acrylate, and the like.

Examples of the repeating unit having a cyclic carbonate structure include a repeating unit shown by the following general formula (6), and the like.

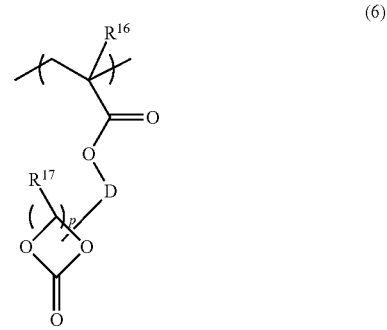

(6)

wherein $R^{16}$ represents a hydrogen atom, a methyl group, or a trifluoromethyl group, $R^{17}$ represents a hydrogen atom or a chain-like hydrocarbon group having 1 to 5 carbon atoms, D represents a single bond, a divalent or trivalent chain-like hydrocarbon group having 1 to 30 carbon atoms, a divalent or trivalent alicyclic hydrocarbon group having 3 to 30 carbon atoms, or a divalent or trivalent aromatic hydrocarbon group having 6 to 30 carbon atoms, provided that a carbon atom included in D is bonded to a carbon atom that forms the cyclic carbonate to form a cyclic structure when D represents a trivalent group, and p is an integer from 2 to 4.

Among the repeating unit shown by the general formula (6), repeating units shown by the following general formulas (6-1) to (6-22) are preferable. Note that $R^{16}$ in the general formulas (6-1) to (6-22) represents a hydrogen atom, a methyl group, or a trifluoromethyl group.

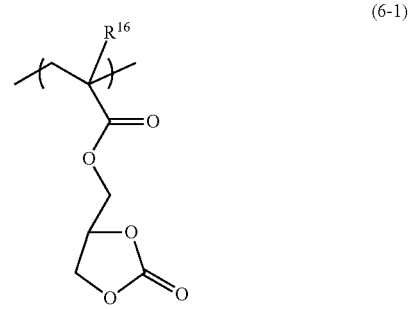

(6-1)

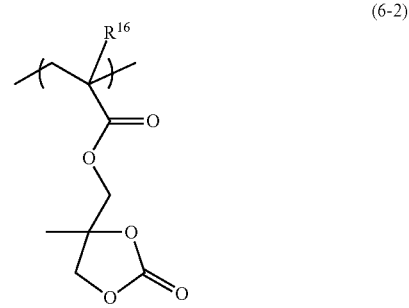

(6-2)

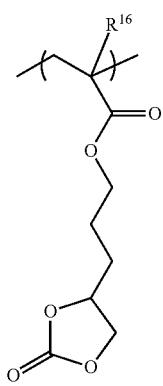 (6-3)
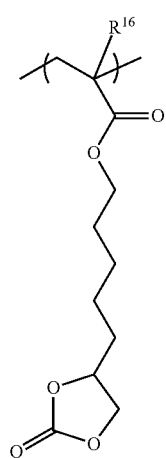 (6-4)
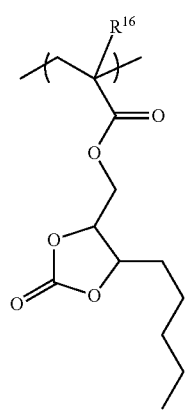 (6-5)
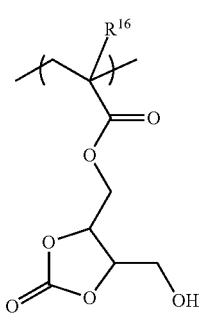 (6-6)
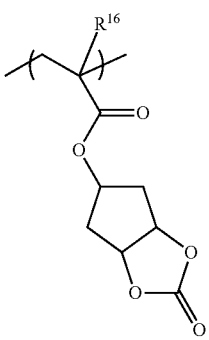 (6-7)
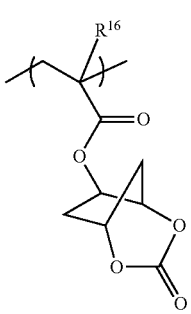 (6-8)
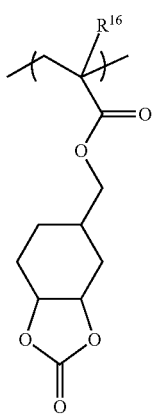 (6-9)
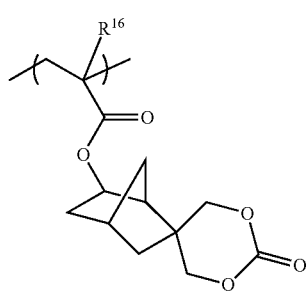 (6-10)

(6-11)
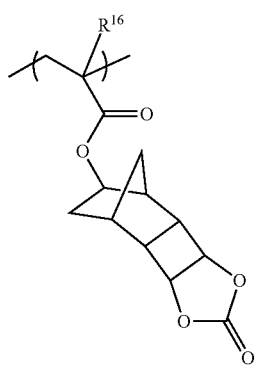
(6-12)
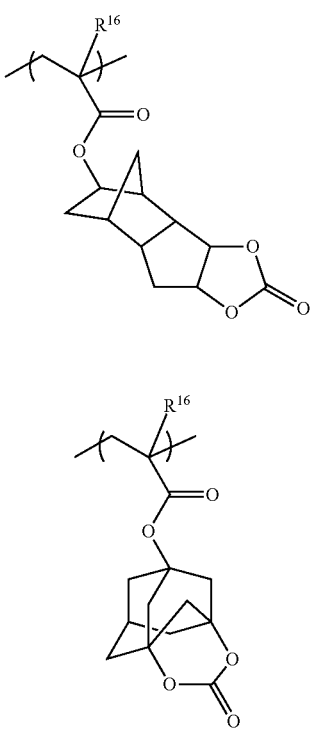
(6-13)
(6-14)
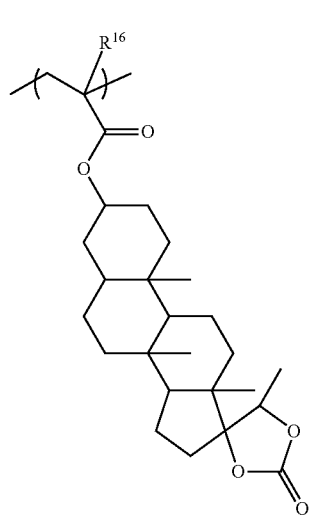
(6-15)
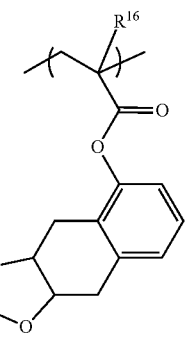
(6-16)
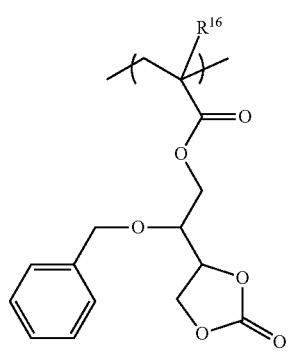
(6-17)
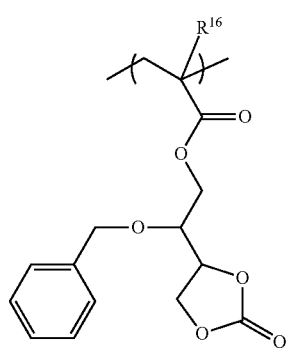
(6-18)
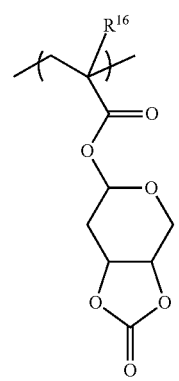

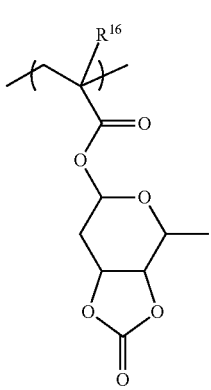
(6-19)

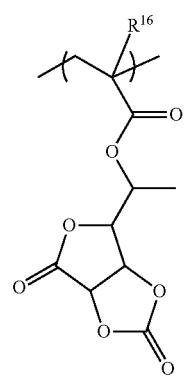
(6-20)

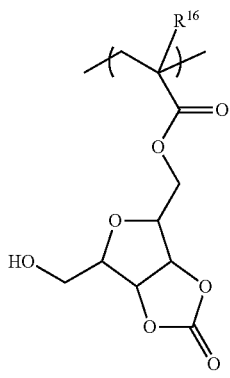
(6-21)

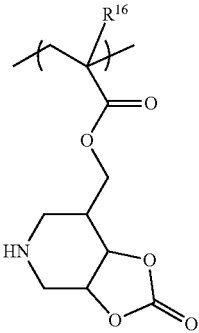
(6-22)

Examples of the divalent chain-like hydrocarbon group having 1 to 30 carbon atoms represented by D in the general formula (6) include linear alkylene groups such as a methylene group, an ethylene group, a 1,2-propylene group, a 1,3-propylene group, a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, and an icosylene group; branched alkylene groups such as a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; and the like.

Examples of the trivalent chain-like hydrocarbon group having 1 to 30 carbon atoms represented by D include a group obtained by removing one hydrogen atom from the divalent chain-like hydrocarbon group having 1 to 30 carbon atoms, and the like.

Specific examples of the repeating unit when D represents a chain-like hydrocarbon group include the repeating units shown by the general formulas (6-1) to (6-6), and the like. That is, the oxygen atom of (meth)acrylic acid that forms the polymer (A) is bonded to the carbon atom that forms the cyclic carbonate structure via a linear alkyl group having 1 to 5 carbon atoms. The chain-like hydrocarbon group may be substituted with a substituent (e.g., the repeating unit shown by the general formulas (6-16)).

A carbon atom included in D and a carbon atom that forms the cyclic carbonate structure may be bonded to each other to form a cyclic structure. That is, the cyclic carbonate structure may form part of a bridged ring, a condensed ring, or a spiro ring. For example, a bridged ring or a condensed ring is formed when the cyclic structure includes two carbon atoms of the cyclic carbonate structure, and a spiro ring is formed when the cyclic structure includes only one carbon atom of the cyclic carbonate structure. The repeating units shown by the general formulas (6-7), (6-9), (6-11), (6-12), (6-15), and (6-17) to (6-22) are examples in which a condensed ring (5 to 6-membered ring) that includes a carbon atom included in D and two carbon atoms that form the cyclic carbonate structure is formed. Meanwhile, the repeating units shown by the general formulas (6-10) and (6-14) are examples in which a spiro ring is formed by a carbon atom included in D and one carbon atom that forms the cyclic carbonate structure.

Note that the cyclic structure may be a hetero ring that includes a heteroatom (e.g., oxygen atom (O) or nitrogen atom (N)), such as the repeating units shown by the general formula (6-17) to (6-22). The repeating units shown by the general formulas (6-8) and (6-13) are examples in which a bridged ring that includes two carbon atoms included in D and two carbon atoms that form the cyclic carbonate structure is formed.

The term "alicyclic hydrocarbon group" in this specification means a hydrocarbon group that includes only an alicyclic hydrocarbon structure as a ring structure, and does not include an aromatic ring structure. Note that the alicyclic hydrocarbon group need not necessarily be formed only of an alicyclic hydrocarbon structure, but may include a chain-like structure as a part.

Examples of the divalent alicyclic hydrocarbon group include monocyclic cycloalkylene groups having 3 to 10 carbon atoms, such as a 1,3-cyclobutylene group, a 1,3-cyclopentylene group, a 1,4-cyclohexylene group, and a 1,5-cyclooctylene group; polycyclic cycloalkylene groups such as a 1,4-norbornylene group, a 2,5-norbornylene group, a 1,5-admantylene group, and a 2,6-admantylene group; and the like.

Examples of the trivalent alicyclic hydrocarbon group include a group obtained by removing one hydrogen atom from the divalent alicyclic hydrocarbon group, and the like.

Specific examples of the repeating unit when D represents an alicyclic hydrocarbon group include a repeating unit in which the oxygen atom of (meth)acrylic acid that forms the polymer (A) is bonded to the carbon atom that forms the cyclic carbonate via a cyclopentylene group (e.g., the repeating unit shown by the general formula (6-10)), a repeating unit in which the oxygen atom of (meth)acrylic acid that forms the polymer (A) is bonded to the carbon atom that forms the cyclic carbonate via a norbornylene group (e.g., the repeating units shown by the general formulas (6-11) and (6-12)), a repeating unit in which the oxygen atom of (meth)acrylic acid that forms the polymer (A) is bonded to the carbon atom that forms the cyclic carbonate via a substituted tetradecahydrophenanthryl group (e.g., the repeating unit shown by the general formula (6-14)), and the like.

The repeating units shown by the general formulas (6-11) and (6-12) are examples in which a condensed ring (4 or 5-membered ring) that includes a carbon atom included in D and two carbon atoms that form the cyclic carbonate structure is formed. The repeating units shown by the general formulas (6-10) and (6-14) are examples in which a spiro ring is formed by a carbon atom included in D and one carbon atom that forms the cyclic carbonate is.

The term "aromatic hydrocarbon group" in this specification means a hydrocarbon group that includes an aromatic ring structure as a ring structure. Note that the aromatic hydrocarbon group need not necessarily be formed only of an aromatic ring structure, but may include a chain-like structure or an alicyclic hydrocarbon structure as a part.

Examples of the divalent aromatic hydrocarbon group include arylene groups such as a phenylene group, a tolylene group, a naphthylene group, a phenanthrylene group, and an anthrylene group, and the like. Examples of the trivalent aromatic hydrocarbon group include a group obtained by removing one hydrogen atom from the divalent aromatic hydrocarbon group, and the like.

Examples of the repeating unit when D represents an aromatic hydrocarbon group include a structure in which the oxygen atom of (meth)acrylic acid that forms the polymer (A) is bonded to the carbon atom that forms the cyclic carbonate via a benzylene group (e.g., the repeating unit shown by the general formula (6-15)), and the like. The repeating unit shown by the general formula (6-15) is an example in which a condensed ring (6-membered ring) that includes a carbon atom included in D and two carbon atoms that form the cyclic carbonate structure is formed.

p in the general formula (6) is an integer from 2 to 4 as referred to above. That is, the cyclic carbonate structure has a 5-membered ring structure when p is 2 (ethylene group), has a 6-membered ring structure when p is 3 (propylene group), and has a 7-membered ring structure when p is 4 (butylene group).

A monomer that produces the repeating unit shown by the general formula (6) may be synthesized by the conventional method, such as disclosed in Tetrahedron Letters, Vol. 27, No. 32, p. 3741 (1986), Organic Letters, Vol. 4, No. 15, p. 2561 (2002), or the like.

It is preferable that the polymer (A) include at least one repeating unit selected from the group consisting of the repeating units shown by the general formulas (5-1) to (5-6) and the repeating unit shown by the general formula (6-1) as the repeating unit (IV) since the resulting resist film exhibits improved solubility in a developer.

The polymer (A) may include only one type of the repeating unit (IV), or may include two or more types of the repeating unit (IV).

The content ratio of the repeating unit (IV) in the polymer (A) is preferably 50 mol % or less, more preferably 5 to 30 mol %, and particularly preferably 5 to 20 mol %, based on the total repeating units (=100 mol %) included in the polymer (A). If the content ratio of the repeating unit (IV) is within the above range, the resulting resist film exhibits water repellency, and has an improved contact angle with a developer after PEB. If the content ratio of the repeating unit (IV) exceeds 50 mol %, the resulting resist film may not exhibit sufficient water repellency, or may not have an improved contact angle with a developer.

[1-1-3] Properties of Polymer (A)

The polystyrene-reduced weight average molecular weight (hereinafter may be referred to as "Mw") of the polymer (A) determined by gel permeation chromatography (GPC) is preferably 1000 to 50,000, more preferably 1000 to 40,000, and particularly preferably 1000 to 30,000. If the Mw of the polymer (A) is less than 1000, a resist film that has a sufficient receding contact angle may not be obtained. If the Mw of the polymer (a) exceeds 50,000, the developability of the resulting resist film may deteriorate (i.e., development defects may occur).

The ratio Mw/Mn of the Mw to the polystyrene-reduced number average molecular weight (hereinafter may be referred to as "Mn") of the polymer (A) determined by GPC is preferably 1 to 5, and more preferably 1 to 4. If the ratio Mw/Mn exceeds 5, a resist film that has a sufficient receding contact angle may not be obtained, and the developability of the resulting resist film may deteriorate (i.e., development defects may occur).

[1-1-4] Production of Polymer (A)

The polymer (A) may be produced by polymerizing polymerizable compounds including a compound that produces each repeating unit (repeating units (I) to (IV)) in an appropriate solvent optionally in the presence of a chain transfer agent using a radical initiator (e.g., hydroperoxide, dialkyl peroxide, diacyl peroxide, or azo compound).

Examples of the solvent used for polymerization include alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylates such as ethyl acetate, n-butyl acetate, i-butyl acetate, and methyl propionate; ketones such as acetone, 2-butanone, 4-methyl-2-pentanone, and 2-heptanone; ethers such as tetrahydrofuran, dimethoxyethane, and diethoxyethane; alcohols such as methanol, ethanol, 1-propanol, 2-propanol, and 4-methyl-2-pentanol; and the like. These solvents may be used either individually or in combination.

The polymerization temperature is preferably 40 to 150° C., and more preferably 50 to 120° C. The polymerization (reaction) time is preferably 1 to 48 hours, and more preferably 1 to 24 hours.

It is preferable to keep the amount of the impurity (e.g., halogen ions and metals) in the polymer (A) as low as possible. The sensitivity, the resolution, the process stability, the pattern shape, and the like of the resulting resist film can be further improved by reducing the amount of the impurity in the polymer (A).

The polymer (A) may be purified by chemical purification (e.g., washing with water or liquid-liquid extraction), or a combination of chemical purification and physical purification (e.g., ultrafiltration or centrifugation), for example.

Examples of the solvent used for liquid-liquid extraction include alkanes such as n-pentane, n-hexane, n-heptane, n-octane, n-nonane, and n-decane, alcohols such as methanol, ethanol, 1-propanol, 2-propanol, and 4-methyl-2-pentanol, and ketones such as acetone, 2-butanone, 4-methyl-2-pentanone, and 2-heptanone. Among these, n-hexane, n-heptane, methanol, ethanol, acetone, and 2-butanone are preferable.

[1-1-5] Compound that Produces Repeating Unit (I)

Examples of a compound that produces the repeating unit (1) include the compound shown by the general formula (2) (i.e., the compound according one embodiment of the invention), and the like. The compound shown by the general formula (2) includes the structure shown by the general formula (1) in the molecular structure. The compound shown by the general formula (2) may be used as a material for a polymer (polymer (A)) included in a radiation-sensitive resin composition that may be used as a material for a resist film that has a high receding contact angle with an immersion exposure liquid (e.g., water) and rarely produces development defects. That is, the compound according to one embodiment of the invention is a polymerizable compound, and a radiation-sensitive resin composition that includes a polymer synthesized using the compound according to one embodiment of the invention (i.e., a polymer that includes a repeating unit derived from the compound according to one embodiment of the invention) can form a resist film that has a high receding contact angle and rarely produces development defects.

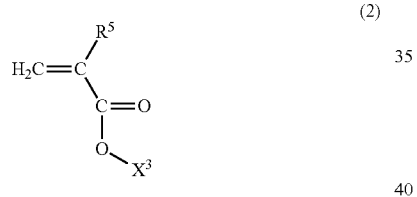

(2)

wherein $R^5$ represents a hydrogen atom, a methyl group, or a trifluoromethyl group, and $X^3$ represents the structure shown by the general formula (1).

Specific examples of the compound shown by the general formula (2) or (2-1) include compounds shown by the following general formulas (2-1a) to (2-1i), and the like. Note that a compound in which a fluorine atom is bonded to the carbon atom adjacent to the carbon atom bonded to $R^1$ is excluded. $R^1$ in the general formulas (2-1a) to (2-1i) represents a monovalent hydrocarbon group having 1 to 5 carbon atoms, $n_1$ is an integer from 1 to 7, and $n_2$ is an integer from 1 to 4.

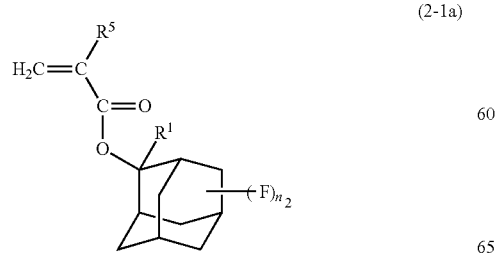

(2-1a)

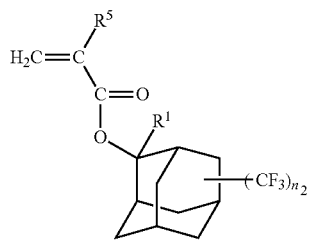

(2-1b)

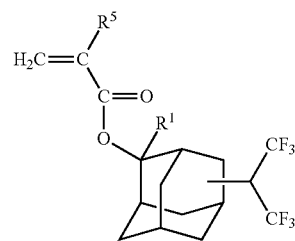

(2-1c)

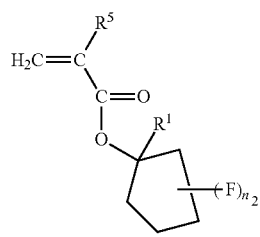

(2-1d)

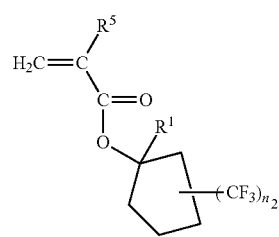

(2-1e)

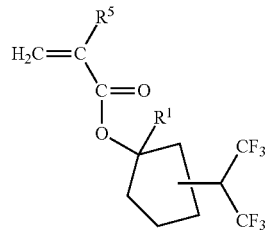

(2-1f)

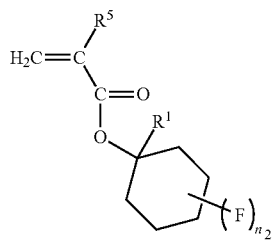

(2-1g)

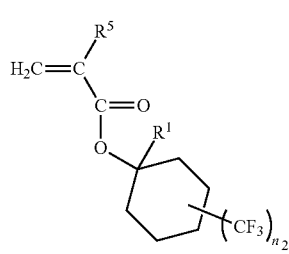

(2-1h)

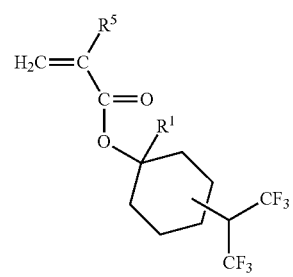

(2-1i)

Among these, the compound shown by the following formula (2-1-1) and the compound shown by the following formula (2-1-2) are preferable.

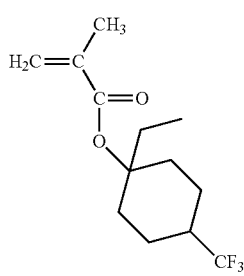

(2-1-1)

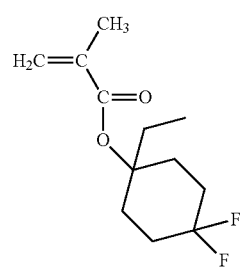

(2-1-2)

The compound shown by the general formula (2) may be obtained by reacting a compound shown by the following general formula (1-3) with (meth)acrylic chloride in the presence of a catalyst, for example. Examples of the catalyst include 4-dimethylaminopyridine and the like.

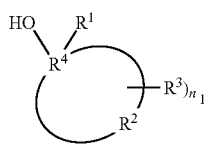

(1-3)

wherein $R^1$ to $R^4$ are the same as defined for the general formula (1), and $n_1$ is an integer from 1 to 7, provided that a fluorine atom is not bonded to a carbon atom of the divalent hydrocarbon group represented by $R^2$ that is adjacent to the carbon atom represented by $R^4$.

The compound shown by the general formula (1-3) may be obtained by reacting a compound shown by the following general formula (1-4) with a Grignard reagent or the like, for example.

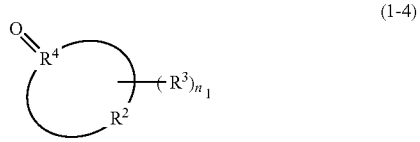

(1-4)

wherein $R^2$ represents a divalent hydrocarbon group that is bonded to a carbon atom represented by $R^4$ to form a cyclic structure, $R^3$ represents a fluorine atom or a monovalent hydrocarbon group having 1 to 10 carbon atoms that is at least partially substituted with a fluorine atom, provided that a plurality of $R^3$ may be either the same or different when a plurality of $R^3$ are present, and the structure shown by the general formula (1-4) includes 7 or less fluorine atoms in total, $R^4$ represents a carbon atom, and $n_1$ is an integer from 1 to 7, provided that a fluorine atom is not bonded to the carbon atom of the divalent hydrocarbon group represented by $R^2$ that is adjacent to the carbon atom represented by $R^4$.

The radiation-sensitive resin composition may include only one type of the polymer (A), or may include two or more types of polymer (A).

[1-2] Radiation-Sensitive Acid-Generating Agent (B)

The radiation-sensitive acid-generating agent (B) (hereinafter may be referred to as "acid-generating agent (B)") generates an acid upon exposure. The acid-labile group included in the polymer (A) dissociates due to the acid generated by the acid-generating agent (B), so that the polymer (A) becomes alkali-soluble. Specifically, since the exposed area of the resist film becomes soluble in an alkaline developer, a positive-tone resist pattern can be formed by developing the resist film using an alkaline developer.

The acid-generating agent (B) is not particularly limited as long as generating an acid upon exposure. It is preferable that the acid-generating agent (B) include a compound shown by the following general formula (7) so that the acid-generating agent (B) advantageously generates an acid upon exposure.

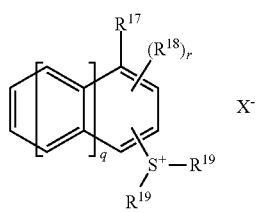

(7)

wherein $R^{17}$ represents a hydrogen atom, a fluorine atom, a hydroxyl group, a linear or branched alkyl group having 1 to 10 carbon atoms, a linear or branched alkoxy group having 1 to 10 carbon atoms, or a linear or branched alkoxycarbonyl group having 2 to 11 carbon atoms, $R^{18}$ represents a linear or branched alkyl group having 1 to 10 carbon atoms, a linear or branched alkoxy group having 1 to 10 carbon atoms, or a linear, branched, or cyclic alkanesulfonyl group having 1 to 10 carbon atoms, r is an integer from 1 to 10, $R^{19}$ individually represent a linear or branched alkyl group having 1 to 10 carbon atoms, a substituted or unsubstituted phenyl group, or a substituted or unsubstituted naphthyl group, or bond to form a substituted or unsubstituted divalent group having 2 to 10 carbon atoms, q is an integer from 0 to 2, and $X^-$ represents an anion shown by $R^{20}C_nF_{2n}SO_3^-$ or $R^{21}SO_3^-$ (wherein $R^{20}$ and $R^{21}$ represent a fluorine atom or a substituted or unsubstituted hydrocarbon group having 1 to 12 carbon atoms, and n is an integer from 1 to 10), or an anion shown by the following general formula (8-1) or (8-2).

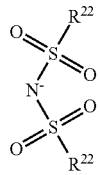
(8-1)

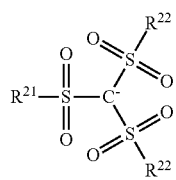
(8-2)

$R^{22}$ in the general formula (8-1) individually represent a linear or branched fluoroalkyl group having 1 to 10 carbon atoms, or bond to each other to form a substituted or unsubstituted divalent organic group having 2 to 10 carbon atoms that includes a fluorine atom. $R^{22}$ in the general formula (8-2) individually represent a linear or branched fluoroalkyl group having 1 to 10 carbon atoms, or bond to each other to form a substituted or unsubstituted divalent organic group having 2 to 10 carbon atoms that includes a fluorine atom.

Examples of the linear or branched alkyl group having 1 to 10 carbon atoms represented by $R^{17}$, $R^{18}$, and $R^{19}$ in the general formula (7) include a methyl group, an ethyl group, an n-butyl group, a 2-methylpropyl group, a 1-methylpropyl group, a t-butyl group, an n-pentyl group, and the like. Among these, a methyl group, an ethyl group, an n-butyl group, and a t-butyl group are preferable.

Examples of the linear or branched alkoxy group having 1 to 10 carbon atoms represented by $R^{17}$ and $R^{18}$ include a methoxy group, an ethoxy group, an n-propoxy group, an i-propoxy group, an n-butoxy group, a 2-methylpropoxy group, a 1-methylpropoxy group, a t-butoxy group, and the like. Among these, a methoxy group, an ethoxy group, an n-propoxy group, and an n-butoxy group are preferable.

Examples of the linear or branched alkoxycarbonyl group having 2 to 11 carbon atoms represented by $R^{17}$ include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, and the like. Among these, a methoxycarbonyl group, an ethoxycarbonyl group, and an n-butoxycarbonyl group are preferable.

Examples of the linear, branched, or cyclic alkanesulfonyl group having 1 to 10 carbon atoms represented by $R^{18}$ include a methanesulfonyl group, an ethanesulfonyl group, an n-propanesulfonyl group, an n-buthanesulfonyl group, a tert-butanesulfonyl group, a cyclopentanesulfonyl group, a cyclohexanesulfonyl group, and the like. Among these, a methanesulfonyl group, an ethanesulfonyl group, an n-propanesulfonyl group, an n-butanesulfonyl group, a cyclopentanesulfonyl group, and a cyclohexanesulfonyl group are preferable.

r is an integer from 0 to 10, and preferably an integer from 0 to 2.

Examples of the substituted or unsubstituted phenyl group represented by $R^{19}$ include a phenyl group; phenyl groups substituted with a linear, branched, or cyclic alkyl group having 1 to 10 carbon atoms, such as a 4-ethylphenyl group, a 4-t-butylphenyl group, a 4-cyclohexylphenyl group, and a 4-fluorophenyl group; groups obtained by substituting a phenyl group or an alkyl-substituted phenyl group with at least one group (e.g., alkoxy group, alkoxyalkyl group, alkoxycarbonyl group, alkoxycarbonyloxy group, hydroxyl group, carboxyl group, cyano group, or nitro group); and the like.

Examples of the alkoxy group that may substitute a phenyl group or an alkyl-substituted phenyl group include linear, branched, or cyclic alkoxy groups having 1 to 20 carbon atoms, such as a methoxy group, an ethoxy group, an n-propoxy group, a t-butoxy group, a cyclopentyloxy group, and a cyclohexyloxy group, and the like.

Examples of the alkoxyalkyl group include linear, branched, or cyclic alkoxyalkyl groups having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group, and the like.

Examples of the alkoxycarbonyl group include linear, branched, or cyclic alkoxycarbonyl groups having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl group, and the like.

Examples of the alkoxycarbonyloxy group include linear, branched, or cyclic alkoxycarbonyloxy groups having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyl group, and a cyclohexyloxycarbonyl group, and the like.

The substituted or unsubstituted phenyl group represented by $R^{19}$ is preferably a phenyl group, a 4-cyclohexylphenyl group, a 4-t-butylphenyl group, a 4-methoxyphenyl group, or a 4-t-butoxyphenyl group.

Examples of the substituted or unsubstituted naphthyl group represented by $R^{19}$ include a naphthyl group (e.g., 1-naphthyl group); a naphthyl group substituted with a linear, branched, or cyclic alkyl group having 1 to 10 carbon atoms, such as a 2-methyl-1-naphthyl group, a 3-methyl-1-naphthyl group, a 4-methyl-1-naphthyl group, a 5-methyl-1-naphthyl group, a 6-methyl-1-naphthyl group, a 7-methyl-1-naphthyl group, a 8-methyl-1-naphthyl group, a 2,3-dimethyl-1-naphthyl group, a 2,4-dimethyl-1-naphthyl group, a 2,5-dimethyl-1-naphthyl group, a 2,6-dimethyl-1-naphthyl group, a 2,7-dimethyl-1-naphthyl group, a 2,8-dimethyl-1-naphthyl group, a 3,4-dimethyl-1-naphthyl group, a 3,5-dimethyl-1-naphthyl group, a 3,6-dimethyl-1-naphthyl group, a 3,7-dimethyl-1-naphthyl group, a 3,8-dimethyl-1-naphthyl group, a 4,5-dimethyl-1-naphthyl group, a 5,8-dimethyl-1-naphthyl group, a 4-ethyl-1-naphthyl group, a 2-naphthyl group, a 1-methyl-2-naphthyl group, a 3-methyl-2-naphthyl group, and a 4-methyl-2-naphthyl group; a group obtained by substituting a naphthyl group or the alkyl-substituted naphthyl group with at least one group selected from a hydroxyl group, a carboxyl group, a cyano group, a nitro group, an alkoxy group, an alkoxyalkyl group, an alkoxycarbonyl group, and an alkoxycarbonyloxy group; and the like.

Examples of a substituent that substitutes a naphthyl group or the alkyl-substituted naphthyl group include the substituents mentioned above in connection with a phenyl group or the alkyl-substituted phenyl group.

The substituted or unsubstituted naphthyl group represented by $R^{19}$ is preferably a 1-naphthyl group, a 1-(4-methoxynaphthyl) group, a 1-(4-ethoxynaphthyl) group, a 1-(4-n-propoxynaphthyl) group, a 1-(4-n-butoxynaphthyl) group, a 2-(7-methoxynaphthyl) group, a 2-(7-ethoxynaphthyl) group, a 2-(7-n-propoxynaphthyl) group, or a 2-(7-n-butoxynaphthyl) group.

The substituted or unsubstituted divalent group having 2 to 10 carbon atoms formed by two $R^9$ is preferably a group that forms a 5 or 6-membered ring (more preferably a 5-membered ring (i.e., tetrahydrothiophene ring)) together with the sulfur atom included in the compound shown by the general formula (7).

Examples of a substituent that substitutes the divalent group having 2 to 10 carbon atoms include the groups (e.g., hydroxyl group, carboxyl group, cyano group, nitro group, alkoxy group, alkoxyalkyl group, alkoxycarbonyl group, and alkoxycarbonyloxy group) mentioned above in connection with a phenyl group and the alkyl-substituted phenyl group.

It is preferable that $R^{19}$ represent a methyl group, an ethyl group, a phenyl group, a 4-methoxyphenyl group, or a 1-naphthyl group, or two of $R^{19}$ bond to each other to form a divalent group having a tetrahydrothiophene ring structure together with the sulfur atom.

When $X^-$ represents an anion shown by $R^{20}C_nF_{2n}SO_3^-$, "—$C_nF_{2n}$—" is a perfluoroalkylene group having n carbon atoms. The perfluoroalkylene group may be either linear or branched. n is preferably 1, 2, 4, or 8.

The substituted or unsubstituted hydrocarbon group having 1 to 12 carbon atoms represented by $R^{20}$ and $R^{21}$ is preferably an alkyl group having 1 to 12 carbon atoms, a cycloalkyl group, or a bridged alicyclic hydrocarbon group. The substituted or unsubstituted hydrocarbon group having 1 to 12 carbon atoms represented by $R^{20}$ and $R^{21}$ is more preferably a methyl group, an ethyl group, an n-propyl group, an i-propyl group, an n-butyl group, a 2-ethylhexyl group, an n-nonyl group, an n-decyl group, a norbornyl group, a norbornylmethyl group, a hydroxynorbornyl group, or an adamantyl group.

Examples of the linear or branched fluoroalkyl group having 1 to 10 carbon atoms represented by $R^{22}$ in the general formula (8-1) include a trifluoromethyl group, a pentafluoroethyl group, a heptafuluoropropyl group, a nonafluorobutyl group, a dodecafluoropentyl group, a perfluorooctyl group, and the like.

Examples of the substituted or unsubstituted divalent organic group having 2 to 10 carbon atoms that includes a fluorine atom formed by two $R^{22}$ include a tetrafluoroethylene group, a hexafluoropropylene group, an octafluorobutylene group, a decafluoropentylene group, an undecafluorohexylene group, and the like.

$R^{22}$ in the general formula (8-2) is the same as defined for $R^{22}$ in the general formula (8-1).

The anion represented by $X^-$ is preferably a trifluoromethanesulfonate anion, a perfluoro-n-butanesulfonate anion, a perfluoro-n-octanesulfonate anion, a 2-bicyclo[2.2.1]hept-2-yl-1,1,2,2-tetrafluoroethanesulfonate anion, a 2-bicyclo[2.2.1]hept-2-yl-1,1-difluoroethanesulfonate anion, or any of the anions shown by the following formulas (9-1) to (9-7).

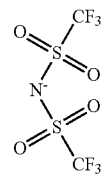

(9-1)

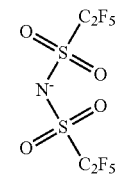

(9-2)

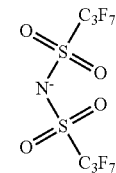

(9-3)

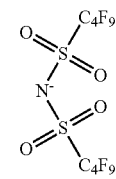

(9-4)

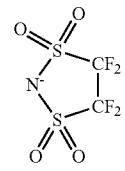

(9-5)

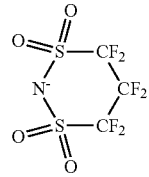

(9-6)

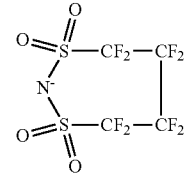

(9-7)

Specific examples of the compound shown by the general formula (7) include triphenylsulfonium trifluoromethanesulfonate, tri-tert-butylphenylsulfonium trifluoromethanesulfonate, 4-cyclohexylphenyl-diphenylsulfonium trifluoromethanesulfonate, 4-methanesulfonylphenyl-diphenylsulfonium trifluoromethanesulfonate,
1-(3,5-dimethyl-4-hydroxyphenyl)tetrahydrothiophenium trifluoromethanesulfonate,
1-(4-n-butoxynaphthyl)tetrahydrothiophenium trifluoromethanesulfonate,
triphenylsulfonium perfluoro-n-butanesulfonate, tri-tert-butylphenylsulfonium perfluoro-n-butanesulfonate, 4-cyclohexylphenyl-diphenylsulfonium perfluoro-n-butanesulfonate, 4-methanesulfonylphenyl-diphenylsulfonium perfluoro-n-butanesulfonate, 1-(3,5-dimethyl-4-hydroxyphenyl)tetrahydrothiophenium perfluoro-n-butanesulfonate, 1-(4-n-butoxynaphthyl)tetrahydrothiophenium perfluoro-n-butanesulfonate,
triphenylsulfonium perfluoro-n-octanesulfonate, tri-tert-butylphenylsulfonium perfluoro-n-octanesulfonate, 4-cyclohexylphenyl-diphenylsulfonium perfluoro-n-octanesulfonate, 4-methanesulfonylphenyl-diphenylsulfonium perfluoro-n-octanesulfonate, 1-(3,5-dimethyl-4-hydroxyphenyl)tetrahydrothiophenium perfluoro-n-octanesulfonate, 1-(4-n-butoxynaphthyl)tetrahydrothiophenium perfluoro-n-octanesulfonate,
triphenylsulfonium 2-(bicyclo[2.2.1]hept-2'-yl)-1,1,2,2-tetrafluoroethanesulfonate,
tri-tert-butylphenylsulfonium 2-(bicyclo[2.2.1]hept-2'-yl)-1,1,2,2-tetrafluoroethanesulfonate,
4-cyclohexylphenyl-diphenylsulfonium 2-(bicyclo[2.2.1]hept-2'-yl)-1,1,2,2-tetrafluoroethane sulfonate, 4-methanesulfonylphenyl-diphenylsulfonium 2-(bicyclo[2.2.1]hept-2'-yl)-1,1,2,2-tetrafluoroethanesulfonate,
1-(3,5-dimethyl-4-hydroxyphenyl)tetrahydrothiophenium 2-(bicyclo[2.2.1]hept-2'-yl)-1,1,2,2-tetrafluoroethanesulfonate,
1-(4-n-butoxynaphthyl)tetrahydrothiophenium 2-(bicyclo[2.2.1]hept-2'-yl)-1,1,2,2-tetrafluoroethanesulfonate,
triphenylsulfonium 2-(bicyclo[2.2.1]hept-2'-yl)-1,1-difluoroethanesulfonate,
tri-tert-butylphenylsulfonium 2-(bicyclo[2.2.1]hept-2'-yl)-1,1-difluoroethanesulfonate,
4-cyclohexylphenyl-diphenylsulfonium 2-(bicyclo[2.2.1]hept-2'-yl)-1,1-difluoroethanesulfonate,
4-methanesulfonylphenyl-diphenylsulfonium 2-(bicyclo[2.2.1]hept-2'-yl)-1,1-difluoroethanesulfonate,
1-(3,5-dimethyl-4-hydroxyphenyl)tetrahydrothiophenium 2-(bicyclo[2.2.1]hept-2'-yl)-1,1-difluoroethanesulfonate,
1-(4-n-butoxynaphthyl)tetrahydrothiophenium 2-(bicyclo[2.2.1]hept-2'-yl)-1,1-difluoroethanesulfonate, the compounds shown by the following formulas (10-1) to (10-15), and the like. These compounds shown by the general formula (7) may be used either individually or in combination.

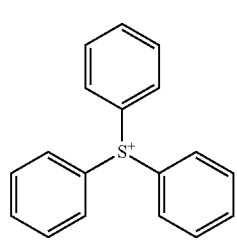
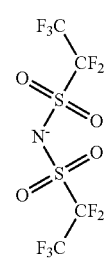

(10-1)

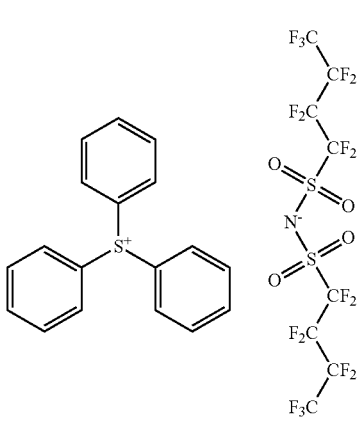

(10-2)

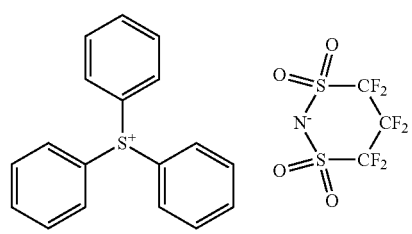

(10-3)

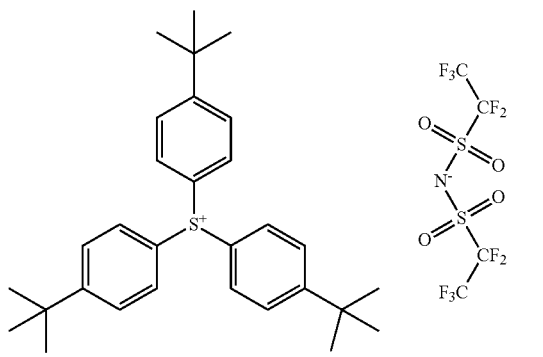

(10-4)

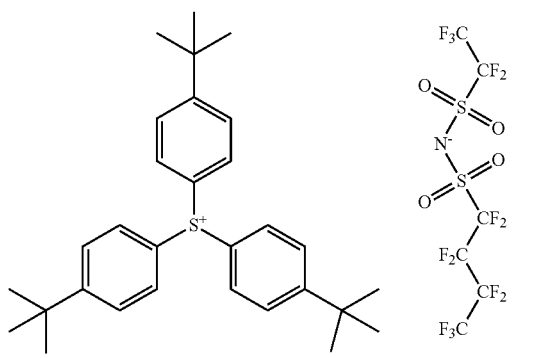

(10-5)

(10-6)
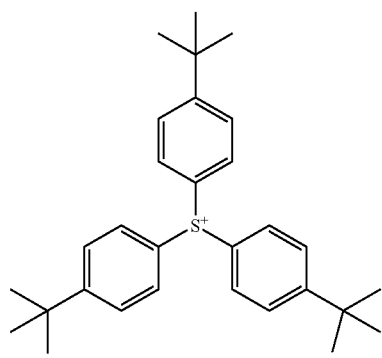 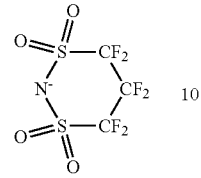
(10-7)
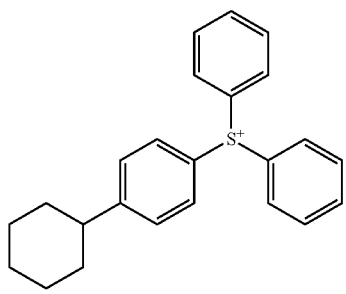 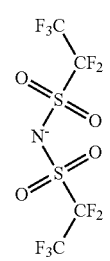
(10-8)
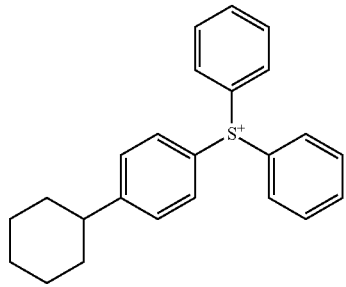 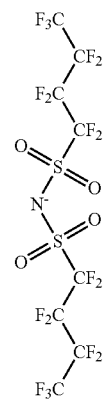
(10-9)
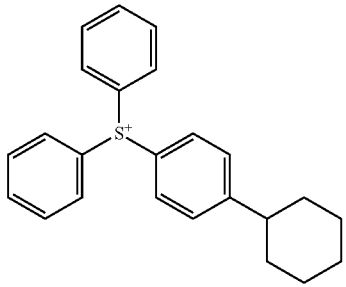 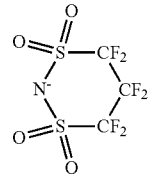
(10-10)
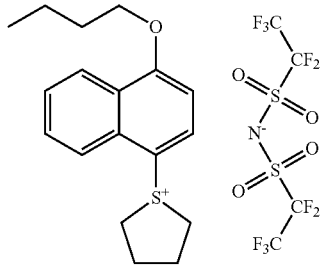
(10-11)
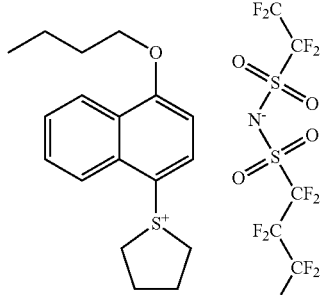
(10-12)
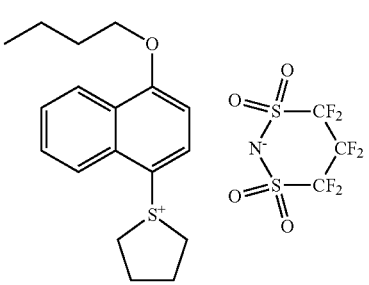
(10-13)
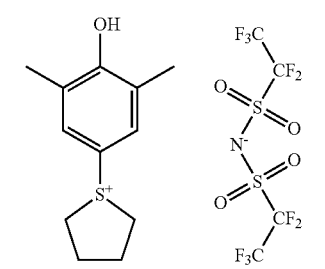
(10-14)
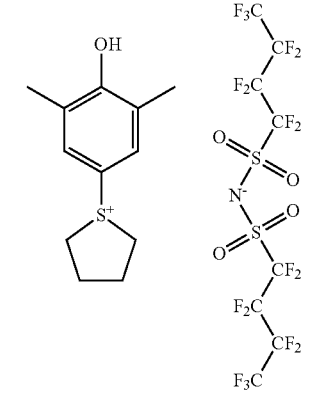

-continued

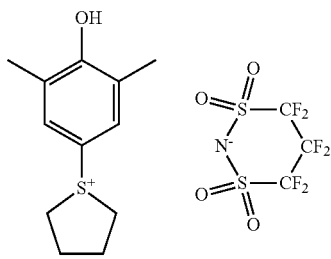

(10-15)

In addition the compound shown by the general formula (7), other acid-generating agent, such as onium salt compounds, halogen-containing compounds, diazoketone compounds, sulfone compounds, sulfonic acid compounds, and the like may be included as the acid-generating agent (B). These other-generating agents may be used either individually or in combination.

The amount of the acid-generating agent (B) is preferably 0.1 to 20 parts by mass, and more preferably 0.5 to 10 parts by mass, based on 100 parts by mass of the polymer (A) (or 100 parts by mass of the polymers (A) and (C) in total in the case that polymer (C) is included). If the amount is within 0.1 to 20 parts by mass, the resulting resist film exhibits excellent sensitivity and developability. If the amount is less than 0.1 parts by mass, the sensitivity and developability of the resulting resist film may be deteriorate. If the amount exceeds 20 parts by mass, a rectangular resist pattern may not be obtained due to a decrease in transparency to radiation (exposure light).

In the case that the compound shown by the general formula (7) and the other acid-generating agent are used together, the content ratio of the other acid-generating agent is preferably 80 mass % or less, and more preferably 60 mass % or less, based on the total amount (=100 mass %) of the compound shown by the general formula (7) and the other acid-generating agent. If the content ratio of the other acid-generating agent exceeds 80 mass %, the sensitivity of the resulting resist film may be deteriorate.

[1-3] Polymer (C)

The radiation-sensitive resin composition according to one embodiment of the invention preferably further includes (C) a polymer that includes a repeating unit having an acid-labile group, and differs from the polymer (A) (hereinafter may be referred to as "polymer (C)"). The acid-labile group included in the polymer (C) dissociates due to an acid, and the polymer (C) becomes alkali-soluble upon dissociation of the acid-labile group. Note that an acid-labile group included in the polymer (C) is an acid-labile group other than the acid-labile group having the structure shown by the general formula (1). When the radiation-sensitive resin composition further includes the polymer (C), a resist film that exhibits high sensitivity can be formed.

The repeating unit having an acid-labile group included in the polymer (C) is not particularly limited as long as the repeating unit has an acid-labile group (excluding the acid-labile group having the structure shown by the general formula (1)), and is preferably the repeating unit (II) that may be included in the polymer (A). When the polymer (C) includes the repeating unit (II) as the repeating unit having an acid-labile group, a resist film that exhibits higher sensitivity can be formed.

The content ratio of the repeating unit (II) in the polymer (C) is preferably 10 to 70 mol %, more preferably 15 to 60 mol %, and particularly preferably 20 to 50 mol %, based on the total repeating units (=100 mol %) included in the polymer (C). If the content ratio is less than 10 mol %, the resolution of the resulting resist film may deteriorate. On the other hand, if the content ratio exceeds 70 mol %, the developability and the exposure latitude may deteriorate.

The polymer (C) preferably further includes a repeating unit having a lactone skeleton (hereinafter referred to as "lactone skeleton-containing repeating unit"). When the polymer (C) includes the lactone skeleton-containing repeating unit, the resulting resist film exhibits improved adhesion to a substrate.

Examples of the lactone skeleton-containing repeating unit include the above mentioned repeating units shown by the general formulas (5-1) to (5-6), and the like.

The content ratio of the lactone skeleton-containing repeating unit in the polymer (C) is preferably 5 to 85 mol %, more preferably 10 to 70 mol %, and particularly preferably 15 to 60 mol %, based on the total repeating units (=100 mol %) included in the polymer (C). If the content ratio is less than 5 mol %, the resulting resist film may exhibit low adhesion to a substrate during development. On the other hand, if the content ratio exceeds 85 mol %, the solubility in a solvent may deteriorate. Moreover, the resolution of the resulting resist film may deteriorate.

The Mw of the polymer (C) determined by GPC is preferably 1000 to 100,000, more preferably 1000 to 30,000, and particularly preferably 1000 to 20,000. If the Mw is less than 1000, the heat resistance of the resulting resist film may deteriorate. On the other hand, if the Mw exceeds 100,000, the developability of the resulting resist may deteriorate.

The ratio (Mw/Mn) of the Mw to the Mn of the polymer (C) is preferably 1 to 3, and more preferably 1 to 2. If the ratio Mw/Mn is within the above range, it is possible to obtain a radiation-sensitive resin composition that can form a resist film having an excellent pattern shape after development.

The polymer (C) may be produced by polymerizing a polymerizable unsaturated monomer that produces above mentioned each repeating unit in an appropriate solvent optionally in the presence of a chain transfer agent using a radical initiator (e.g., hydroperoxide, dialkyl peroxide, diacyl peroxide, or azo compound).

The solvent used for producing the polymer (C), the polymerization temperature, and the polymerization time may be the same as those described in connection with the polymer (A).

When synthesizing the polymer (C) using the polymerizable unsaturated monomers like above mentioned, the content ratio (solid content) of low-molecular-weight components derived from the polymerizable unsaturated monomers (hereinafter may be referred to as "low-molecular-weight components (b)") contained in the polymer (C) is preferably 0.1 mass % or less, more preferably 0.07 mass % or less, and particularly preferably 0.05 mass % or less, based on the total solid content (=100 mass %) of the polymer (C). If the content ratio is 0.1 mass % or less, the amount of components (low-molecular-weight components (b)) eluted into an immersion exposure liquid during liquid immersion lithography decreases. Moreover, foreign material (by-product) rarely precipitates in the radiation-sensitive resin composition during storage, or uneven application rarely occurs when applying the radiation-sensitive resin composition. It is also possible to sufficiently suppress occurrence of defects when forming a resist pattern.

The low-molecular-weight components (b) refer to components having a weight average molecular weight of 500 or less. Specific examples of the low-molecular-weight components (b) include a monomer, a dimer, a trimer, and an oligomer. Incidentally, the low-molecular-weight components (b)

may be removed by chemical purification (e.g., washing with water or liquid-liquid extraction), or a combination of chemical purification and physical purification (e.g., ultrafiltration or centrifugation), for example.

It is preferable that the amount of the impurity (e.g., halogens and metals) in the polymer (C) is as low as possible. The sensitivity, the resolution, the process stability, the pattern shape, and the like of the resulting resist film can be further improved by reducing the amount of the impurity in the polymer (C). Impurities can be removed from the polymer (C) in the same manner as the low-molecular-weight components (b).

The amount of the polymer (A) is preferably 0.1 to 20 parts by mass, and more preferably 0.5 to 15 parts by mass, based on 100 parts by mass of the polymer (C). If the amount of the polymer (A) is within the above range, it is preferable that a resist film that has a sufficient receding contact angle, and has a low receding contact angle with a developer after PEB can be formed. It is also possible to obtain a resist film from which the acid-generating agent (B) and the like are rarely eluted into an immersion exposure liquid. The radiation-sensitive resin composition according to one embodiment of the invention may include only one type of the polymer (C), or may include two or more types of the polymer (C).

[1-4] Other Components

The radiation-sensitive resin composition according to one embodiment of the invention may optionally include a nitrogen-containing compound, a solvent, and an additive (e.g., aliphatic additive, surfactant, or sensitizer) in addition to the polymer (A), the acid-generating agent (B), and the polymer (C).

[1-4-1] Nitrogen-Containing Compound

The nitrogen-containing compound controls a phenomenon in which an acid generated from the acid-generating agent upon exposure is diffused in the resist film, and suppresses undesired chemical reactions in the unexposed area. The storage stability of the radiation-sensitive resin composition can be improved by adding the nitrogen-containing compound. Moreover, the nitrogen-containing compound improves the resolution of the radiation-sensitive resin composition, and suppresses a change in line width of the resist pattern due to a change in post-exposure delay (PED) from exposure to post-exposure bake. As a result, a radiation-sensitive resin composition that exhibits excellent process stability can be obtained.

Examples of the nitrogen-containing compound include tertiary amine compounds, amine compounds other than tertiary amine compounds (other amine compounds), amide group-containing compounds, urea compounds, nitrogen-containing heterocyclic compounds, and the like.

Examples of the tertiary amine compounds include mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; substituted alkylamines such as 2,2',2"-nitrotriethanol; aniline, N-methylaniline, N,N-dimethylaniline, 2-methylaniline, 3-methylaniline, 4-methylaniline, 4-nitroaniline, diphenylamine, triphenylamine, naphthylamine, 2,4,6-tri-tert-butyl-N-methylaniline, N-phenyldiethanolamine, and 2,6-diisopropylaniline, and the like.

Examples of the other amine compounds include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolizinone, 2-quinoxalinol, N,N,N',N'-tetrakis(2-hydroxypropyl)ethylenediamine, N,N,N',N'',N''-pentamethyldiethylenetriamine, and the like.

Examples of the amide group-containing compounds include N-t-butoxycarbonyl group-containing amino compounds such as N-t-butoxycarbonyl-di-n-octylamine, N-t-butoxycarbonyl-di-n-nonylamine, N-t-butoxycarbonyl-di-n-decylamine, N-t-butoxycarbonyl dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxypiperidine, N-t-butoxycarbonylpyrrolidine, N-t-butoxycarbonylpiperazine, N-t-butoxycarbonylpiperidine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate, and the like.

Examples of the urea compounds include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compounds include imidazoles such as imidazole, 4-methylimidazole, 4-methyl-2-phenylimidazole, benzimidazole, 2-phenylbenzimidazole, 1-benzyl-2-methylimidazole, and 1-benzyl-2-methyl-1H-imidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, acridine, and 2,2':6',2''-terpyridine; piperazines such as piperazine and 1-(2-hydroxyethyl)piperazine; pyrazine, pyrazole, pyridazine, quinoxaline, purine, pyrrolidine, piperidine, piperidine ethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

These nitrogen-containing compounds may be used either individually or in combination.

The amount of the nitrogen-containing compound is preferably 15 parts by mass or less, more preferably 10 parts by mass or less, and particularly preferably 5 parts by mass or less, based on 100 parts by mass of the polymer (A). If the amount exceeds 15 parts by mass, the sensitivity of the resulting resist film may deteriorate.

[1-4-2] Solvent

The solvent is not particularly limited as long as the solvent dissolves the polymer (A) to produce a solution of the radiation-sensitive resin composition. Examples of the solvent include linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate;

alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate;

n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methylpropionate, ethyl ethoxyacetate, ethyl hydroxyacetate, methyl 2-hydroxy-3-methylbutyrate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, ethyl acetoacetate, methyl pyruvate, ethyl pyruvate, N-methylpyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and the like.

Among these, linear or branched ketones, cyclic ketones, propylene glycol monoalkyl ether acetates, alkyl 2-hydroxypropionates, alkyl 3-alkoxypropionates, and γ-butyrolactone are preferable. These solvents may be used either individually or in combination.

The solvent is preferably added so that the radiation-sensitive resin composition has a total solid content of 1 to 50 mass % (more preferably 1 to 25 mass %). The radiation-sensitive resin composition may be prepared as a composition solution by adding the solvent, and then filtering the solution through a filter having a pore size of about 0.2 μm, for example.

The radiation-sensitive resin composition according to one embodiment of the invention may be prepared by homogeneously dissolving the polymer (A), the acid-generating agent (B), the polymer (C), and optional components (excluding the solvent) in the solvent, for example. In this case, the amount of the solvent is preferably adjusted so that the radiation-sensitive resin composition has a total solid content within the above range. The radiation-sensitive resin composition thus prepared is preferably filtered through a filter having a pore size of about 0.2 μm, for example.

It is preferable that a resist film formed using the radiation-sensitive resin composition according to one embodiment of the invention have a receding contact angle with water of 68° or more, and more preferably 70° or more. If the receding contact angle with water is within the above range, it is preferable because sufficient water repellency is obtained during high-speed exposure, so that defects such as watermark defects rarely occur.

It is preferable that a resist film (subjected to PEB) formed using the radiation-sensitive resin composition according to one embodiment of the invention have a receding contact angle with a developer of 80° or less, and more preferably 75° or less. If the receding contact angle with a developer is within the above range, it is preferable because sufficient wettability with a developer is obtained during development, so that development defects rarely occur.

Note that the term "receding contact angle with a developer" in this specification means that the angle formed by the surface of a developer and a resist film when dripping 5 μl of a developer onto a resist film formed using the radiation-sensitive resin composition according to one embodiment of the invention. The receding contact angle may be measured using a contact angle meter "DSA-10" (manufactured by KRUS).

[2] Method for Forming Resist Pattern

A method for forming a resist pattern according to one embodiment of the invention includes (1) a step of forming a resist film on a substrate using the above mentioned radiation-sensitive resin composition according to one embodiment of the invention, (2) a step of exposing the resist film via an immersion exposure liquid provided over the resist film, and (3) a step of developing the exposed resist film to form a resist pattern. In the case of adapting such a process, since the method utilizes a resist film that has a high receding contact angle with an immersion exposure liquid (e.g., water) and rarely produces development defects, an excellent resist pattern with a reduced number of defects can be formed.

[2-1] Step (1)

The method for forming a resist pattern according to one embodiment of the invention performs the step (1), which a resist film is formed on a substrate using the radiation-sensitive resin composition according to one embodiment of the invention. Since the resist film formed by the step (1) has a high receding contact angle with an immersion exposure liquid (e.g., water) and rarely produces development defects, a resist pattern formed by using the resist film reduce the number of defects to be excellent.

A silicon wafer, an aluminum-coated wafer, or the like may be used as the substrate.

The resist film may be formed by applying a resin composition solution produced using the radiation-sensitive resin composition according to one embodiment of the invention onto the substrate by an appropriate coating method (e.g., rotational coating, cast coating, or roll coating), and then prebaking (PB) the resulting film to volatilize the solvent from the film, for example. The resin composition solution may be prepared by filtering the radiation-sensitive resin composition through a filter having a pore size of about 0.2 μm after adjusting the total solid content.

The thickness of the resist film is not particularly limited, and is preferably 10 to 5000 nm, and more preferably 10 to 2000 nm.

The prebaking temperature is determined depending on the composition of the radiation-sensitive resin composition, and is preferably about 30 to 200° C., and more preferably 50 to 150° C.

[2-2] Step (2)

Next, the step (2), which the resist film is exposed via an immersion exposure liquid provided over the resist film, is performed.

Purified water, a long-chain or cyclic aliphatic compound, or the like may be used as the immersion exposure liquid.

Radiation used for exposure may be appropriately selected depending on the type of the acid-generating agent (B). Examples of radiation used for exposure include visible rays, ultraviolet rays, far-ultraviolet rays, X-rays, charged particle rays, and the like. Among these, it is preferable to use far-ultraviolet rays such as ArF excimer laser light (wavelength: 193 nm) or KrF excimer laser light (wavelength: 248 nm). It is particularly preferable to use ArF excimer laser light (wavelength: 193 nm).

The exposure conditions (e.g., exposure amount) may be appropriately selected depending on the composition of the radiation-sensitive resin composition, the type of additive, and the like.

In the method for forming a resist pattern according to one embodiment of the invention, it is preferable to perform post-exposure bake (PEB) after exposure. PEB ensures that the acid-labile group included in the resin component dissociates smoothly. The PEB temperature is appropriately adjusted depending on the composition of the radiation-sensitive resin composition, and is preferably 30 to 200° C., and more preferably 50 to 170° C.

In the method for forming a resist pattern according to one embodiment of the invention, in order to maximize the potential of the radiation-sensitive resin composition, an organic or inorganic antireflective film may be formed on a substrate, as disclosed in JP-A-H6-12452 (JP-A-S59-93448), for example. A protective film may be formed on the resist film so that the resist film is not affected by basic impurities and the like contained in the environmental atmosphere, as disclosed in JP-A-H5-188598, for example. In order to prevent outflow of the acid-generating agent and the like from the resist film during liquid immersion lithography, a liquid immersion lithography protective film may be formed on the resist film, as disclosed in JP-A-2005-352384, for example. These techniques may be used in combination.

[2-3] Step (3)

Next, the step (3), which the exposed resist film is developed to form a resist pattern, is performed.

Examples of a developer used for development include an alkaline aqueous solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water.

The concentration of the alkaline aqueous solution is preferably 10 mass % or less. If the concentration of the aqueous alkaline solution exceeds 10 mass %, the unexposed area may be dissolved in the developer.

An organic solvent may be added to the alkaline aqueous solution (developer). Examples of the organic solvent include ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like. These organic solvents may be used either individually or in combination.

The amount of the organic solvent is preferably 100 parts by volume or less based on 100 parts by volume of the alkaline aqueous solution. If the amount of the organic solvent exceeds 100 parts by volume, the exposed area may remain undeveloped due to a decrease in developability.

An appropriate amount of a surfactant or the like may also be added to the alkaline aqueous solution (developer).

After development using the aqueous alkaline solution developer, the resist film is preferably rinsed with water, and dried.

EXAMPLES

The invention is further described below by way of examples and comparative examples. Note that the invention is not limited to the following examples. In the following examples, the units "parts" and "%" respectively refer to "parts by mass" and "mass %" unless otherwise specified. The property measuring methods and the property evaluation methods employed in the examples and comparative examples are described below.

Weight Average Molecular Weight (Mw) and Number Average Molecular Weight (Mn)

The weight average molecular weight (Mw) and the number average molecular weight (Mn) were determined by gel permeation chromatography (GPC) (standard: monodisperse polystyrene) using GPC columns manufactured by Tosoh Corporation (G2000HXL×2, G3000HXL×1, G4000HXL×1) (flow rate: 1.0 ml/min, column temperature: 40° C., eluant: tetrahydrofuran). The dispersity (Mw/Mn) was calculated from the Mw and Mn measurement results.

$^{13}$C-NMR Analysis

The polymer was subjected to $^{13}$C-NMR analysis using a nuclear magnetic resonator "JNM-EX270" (manufactured by JEOL Ltd.).

Advancing Contact Angle and Receding Contact Angle

The radiation-sensitive resin composition was spin-coated onto a substrate using a coater/developer "CLEAN TRACK ACT 8" (manufactured by Tokyo Electron Ltd.), and prebaked (PB) at 100° C. for 60 seconds to form a film having a thickness of 100 nm. Then, the receding contact angle was measured by the following method at a temperature of 23° C.

(room temperature) and a humidity of 45% under atmospheric pressure using a contact angle meter "DSA-10" (manufactured by KRUS).

Specifically, the position of the wafer stage of the contact angle meter "DSA-10" was adjusted, and the substrate was placed on the adjusted stage. After injecting water into the needle, the position of the needle was adjusted to the initial position at which a water droplet can be formed on the adjusted substrate. The water was discharged from the needle to form a water droplet (25 μl) in a state in which the tip of the needle was introduced into the water droplet. After removing the needle from the water droplet, the needle was moved downward to the initial position (i.e., the needle was introduced into the water droplet). The water droplet was sucked through the needle for 90 seconds at a rate of 10 μl/min, and the contact angle formed by the liquid surface of the water droplet and the substrate was measured every second (90 times in total (i.e., 90 seconds)). The average value of twenty contact angle measured values (20 seconds) after the measured value became stable was calculated, and taken as the receding contact angle.

The advancing contact angle was measured by the following method. Specifically, a water droplet (25 μl) was formed in the same manner as in the case of measuring the receding contact angle. After removing the needle from the water droplet, the needle was moved downward to the initial position (i.e., the needle was introduced into the water droplet). The water was discharged into the water droplet through the needle for 90 seconds at a rate of 10 μl/min, and the contact angle formed by the liquid surface of the water droplet and the substrate was measured every second (90 times in total (i.e., 90 seconds)). The average value of twenty contact angle measured values (20 seconds) after the measured value became stable was calculated, and taken as the advancing contact angle.

Change ($\Delta_1$) in Contact Angle with Developer Due to PEB

A substrate (wafer) was obtained in the same manner as in the case of evaluating blob defects (described later). The receding contact angle with a developer before PEB was measured using the substrate in the same manner as described above (see the section entitled "Advancing contact angle and receding contact angle"), except for injecting a developer into the needle instead of water. The substrate was exposed via a 6% HT mask using an ArF excimer laser immersion exposure scanner ("NSR S306C" manufactured by Nikon Corporation) (NA=0.75, σ=0.85, ½ Annular). The substrate was then subjected to post-exposure bake (PEB) at 95° C. for 60 seconds. The receding contact angle with the developer was immediately measured in the same manner as described above. The difference ($\Delta_1$) between the receding contact angle with the developer before PEB and the receding contact angle with the developer after PEB ((receding contact angle before PEB)−(receding contact angle after PEB)) was calculated from the measured values, and evaluated in accordance with the following standard (see the item "Developer contact angle" in Table 4).
A: The difference ($\Delta_1$) was 10° or more.
B: The difference ($\Delta_1$) was 5° or more and less than 10°.
C: The difference ($\Delta_1$) was less than 5°.
Difference ($\Delta_2$) Between Advancing Contact Angle and Receding Contact Angle The difference ($\Delta_2$) between the advancing contact angle and the receding contact angle ((advancing contact angle)−(receding contact angle)) was calculated from the measured values (see the section entitled "Advancing contact angle and receding contact angle"), and evaluated in accordance with the following standard.

A: The absolute value of the difference ($\Delta_2$) between the advancing contact angle and the receding contact angle was less than 20°.
B: The absolute value of the difference ($\Delta_2$) between the advancing contact angle and the receding contact angle was 20° or more.
Blob Defects A film (thickness: 100 nm) of the radiation-sensitive resin composition was formed on a 12-inch silicon wafer on which an underlayer antireflective film ("ARC66" manufactured by Nissan Chemical Industries, Ltd.) was formed. The film was exposed via a mask pattern using an ArF excimer laser immersion exposure scanner ("NSR S610C" manufactured by Nikon Corporation) (NA=1.3, ratio=0.800, Dipole). The film was then subjected to post-exposure bake (PEB) at 95° C. for 60 seconds. The film was developed using a 2.38 mass % tetramethylammonium hydroxide aqueous solution, rinsed with water, and dried to form a positive-tone resist pattern. An exposure amount at which a line-and-space pattern having a width of 45 nm was formed was determined to be an optimum exposure amount. A line-and-space pattern having a width of 45 nm was formed over the entire wafer at the optimum exposure amount to obtain a defect inspection wafer. A scanning electron microscope ("S-9380" manufactured by Hitachi High-Technologies Corporation) was used for the measurement.

The number of defects on the defect inspection wafer was measured using a system "KLA2810" (manufactured by KLA-Tencor). Defects measured using the system "KLA2810" were classified into a defect due to the resist and a defect due to foreign material. After the classification, a case where the number of defects due to the resist was 100 or more per wafer was evaluated as "Unacceptable", and a case where the number of defects due to the resist was less than 100 per wafer was evaluated as "Acceptable".

Hydrodynamic Radius ($R_H$)
Preparation of Evaluation Sample

A film (thickness: 100 nm) of the radiation-sensitive resin composition was formed on a 12-inch silicon wafer on which an underlayer antireflective film ("ARC66" manufactured by Nissan Chemical Industries, Ltd.) was formed. The film was exposed via a mask designed so that a line-and-space (1 L/1 S) pattern was formed (target width: 45 nm) using an ArF excimer laser immersion exposure scanner ("NSR S610C" manufactured by Nikon Corporation) (NA=1.3, ratio=0.800, Dipole). The film was then subjected to post-exposure bake (PEB) at 95° C. for 60 seconds to obtain evaluation substrates.

Above three evaluation substrates was produced. 4 ml of a 2.38 mass % tetramethylammonium hydroxide aqueous solution was applied to each evaluation substrate, and the dissolved component (tetramethylammonium hydroxide aqueous solution) was collected to obtain 12 ml of a solution. The solution was filtered through a membrane filter having a pore size of 1.0 μm to obtain an evaluation sample.

Measurement of Hydrodynamic Radius ($R_H$)

The evaluation sample was injected into a quartz glass cell (diameter: 20 mm) that had been washed for 2 hours or more using an acetone reflux washer, and the hydrodynamic radius ($R_H$) was measured. The hydrodynamic radius ($R_H$) was measured using a system "ALV5000" (manufactured by ALV) while accurately controlling the measurement angle to 60° and the measurement temperature to 23.00±0.02° C. The Contin method was used for analysis. The hydrodynamic radius ($R_H$) was thus measured. Occurrence of aggregation was evaluated by measuring the hydrodynamic radius ($R_H$). The term "aggregation" in this specification refers to aggregation due to a component in the exposed area that has been

Synthesis Example 1

A polymer (C) was synthesized as follows. 40 parts by mass of the compound shown by the following formula (M-A), 10 parts by mass of the compound shown by the following formula (M-B), 40 parts by mass of the compound shown by the following formula (M-C), and 10 parts by mass of the compound shown by the following formula (M-D) were mixed, and reacted at 80° C. to obtain a polymer (C) ("Polymer-1" in Table 2). The polymer (C) had an Mw of 5800 and a dispersity (Mw/Mn) of 1.5. The content ratio of repeating units derived from the compound shown by the formula (M-A) in the polymer (C) was 39.3 mol %, the content ratio of repeating units derived from the compound shown by the formula (M-B) in the polymer (C) was 9.2 mol %, the content ratio of repeating units derived from the compound shown by the formula (M-C) in the polymer (C) was 41.5 mol %, and the content ratio of repeating units derived from the compound shown by the formula (M-D) in the polymer (C) was 10.1 mol %. Incidentally, above all content ratios are based on the total repeating units (=100 mol %) derived from the compounds shown by the formulas (M-A) to (M-D).

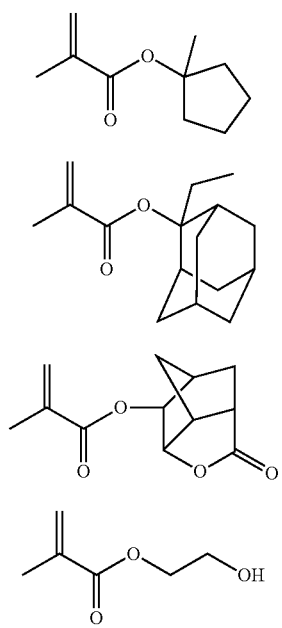

(M-A)

(M-B)

(M-C)

(M-D)

Example 1

1-Ethyl-4-(trifluoromethyl)cyclohexyl methacrylate (compound shown by the following formula (M-3)) was synthesized by the following method.

The inside of a reactor was sufficiently dried by vacuum heating, and the atmosphere inside the reactor was replaced with dry nitrogen. The reactor was charged with a Grignard reagent that was prepared in 350 ml of dehydrated tetrahydrofuran (dehydrated THF) using 9.7 g (0.40 mol) of a magnesium powder and 38.9 g (0.36 mol) of bromoethane 50 ml of a dehydrated THF solution of 49.8 g (0.30 mol) of 4-trifluoromethylcyclohexanone was added to the reactor over 15 minutes with stirring while cooling the solution at -5° C. using an ice bath. After increasing the temperature of the reactor to room temperature, the mixture was stirred for 2 hours. 500 ml of ice water and 100 ml of ice-cooled diluted sulfuric acid were then added to the mixture while sufficiently stirring the mixture. After separating the THF layer, the aqueous layer was extracted with diethyl ether to obtain an extract. The extract was combined with the THF layer, sequentially washed with a 5% sodium carbonate aqueous solution and water, and dried over sodium sulfate (desiccating agent). After removing sodium sulfate using a Buchner funnel, the organic solvent was evaporated. The residue was distilled under reduced pressure (30 mmHg). 1-Ethyl-4-trifluoromethylcyclohexanol was thus obtained (41.2 g (yield: 70%)).

A four-necked flask equipped with a stirrer, a thermometer, and a dropping funnel was charged with 7.9 g (0.04 mol) of 1-ethyl-4-trifluoromethylcyclohexanol, 0.2 g of 4-dimethylaminopyridine, 4.9 g of triethylamine, and 20 g of acetone. The mixture was stirred to obtain a solution. A solution prepared by dissolving 4.6 g (0.044 mol) of methacrylic acid chloride in 5 g of acetone was added to the solution at 4° C. over 30 minutes. The mixture was stirred at 4° C. for 3 hours to obtain a reaction mixture. The reaction mixture was washed with water to obtain 8.0 g of 1-ethyl-4-(trifluoromethyl)cyclohexyl methacrylate (hereinafter may be referred to as "compound (M-3)" ((M-3) in Table 1)). The yield of 1-ethyl-4-(trifluoromethyl)cyclohexyl methacrylate with respect to 1-ethyl-4-trifluoromethylcyclohexanol was 76%.

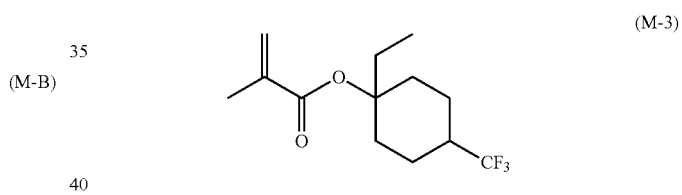

(M-3)

The $^1$H-NMR data for 1-ethyl-4-(trifluoromethyl)cyclohexyl methacrylate obtained in Example 1 is shown below.

$^1$H-NMR (CDCl$_3$) δ: 0.90 (s, 3H, C—CH$_3$), δ: 1.5-1.75 (m, 6H, CH$_2$), δ: 1.84 (s, 4H, CH$_2$), δ: 1.95 (s, 3H, =C—CH$_3$), 2.31 (bs, 1H, CF$_3$—CH), 5.71 (s, 1H, C=CH$_2$), 6.18 (s, 1H, C=CH$_2$).

A polymer (A) was synthesized using the compound (M-3) shown by the formula (M-3).

5.75 g (30 mol %) of the compound (M-3), 9.25 g (70 mol %) of the compound shown by the following formula (M-1) (hereinafter may be referred to as "compound (M-1)"), and 0.092 g (5 mol %) of dimethyl-2,2'-azobisisobutyrate (AIBN) (initiator) were dissolved in 15 g of methyl ethyl ketone to prepare a monomer solution.

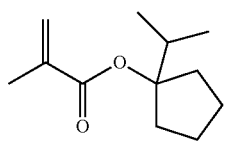

(M-1)

A 200 ml three-necked flask equipped with a thermometer and a dropping funnel was charged with 20 g of methyl ethyl ketone, and purged with nitrogen for 30 minutes. The inside of the flask was heated to 80° C. with stirring using a magnetic stirrer. The monomer solution was added dropwise to the flask using the dropping funnel over 3 hours. After the addition, the mixture was aged for 3 hours, and cooled to 30° C. or less to obtain a polymer solution. The polymer solution was added to 500 g of methanol, and a precipitated white powder was collected by filtration. The white powder thus collected was washed twice with 100 g of methanol in a slurry state, collected again by filtration, and dried at 60° C. for 10 hours to obtain 9.75 g of a white powdery polymer (A) (polymer (A-1)) (yield: 65.0%).

The polymer (A-1) had an Mw of 5500 and a dispersity (Mw/Mn) of 1.4. The content ratio (mol %) of repeating units derived from the compound (M-1) to the content ratio (mol %) of repeating units derived from the compound (M-3) determined by gas chromatography was 99.4/0.6. In Tables 1 and 2, the polymer (A-1) is indicated by "A-1".

A radiation-sensitive resin composition was prepared as follows.

100 parts of the polymer (C) obtained in Synthesis Example 1, 5 parts of the polymer (A-1), and 12 parts of the compound shown by the following formula (b-1) (acid-generating agent (B)) ("PAG1" in Table 3) were mixed. Propylene glycol monomethyl ether acetate (solvent) and cyclohexanone (solvent) were added to the mixture in a ratio of 7:3 to obtain a composition solution (radiation-sensitive resin composition) having a solid content of 5%. Table 3 shows the composition of the composition solution.

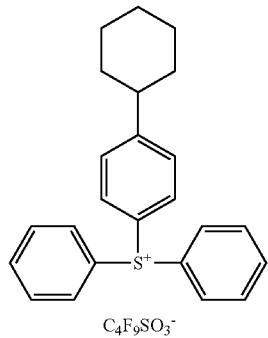

(b-1)

The composition thus prepared was evaluated as described above. The evaluating results of the radiation-sensitive resin composition obtained in Example 1 was that the receding contact angle was 75° or more, the change ($\Delta_1$) in contact angle with the developer (developer contact angle) due to PEB was evaluated as "A", the difference ($\Delta_2$) between the advancing contact angle and the receding contact angle was evaluated as "A", and blob defects were evaluated as "Acceptable".

Examples 2 to 8

A composition solution (radiation-sensitive resin composition) of each of Examples 2 to 8 was prepared in the same manner as in Example 1, except for using the compound shown in Table 3 in the amount shown in Table 3. Each composition solution was evaluated in the same manner as in Example 1. The evaluation results are shown in Table 4. In Table 3, "A-2" to "A-8" respectively indicate polymers (A-2) to (A-8). The polymers (A-2) to (A-8) were obtained by reacting the monomers shown in Table 1 in the amounts shown in Table 1. Table 2 shows the type and the content ratio (mol %) of each repeating unit included in the polymers (A-2) to (A-8). In Table 1, "M-2" indicates the compound shown by the following formula (M-2), "M-4" indicates the compound shown by the following formula (M-4), "M-5" indicates the compound shown by the following formula (M-5), "M-6" indicates the compound shown by the following formula (M-6), "M-7" indicates the compound shown by the following formula (M-7), and "M-9" indicates the compound shown by the following formula (M-9).

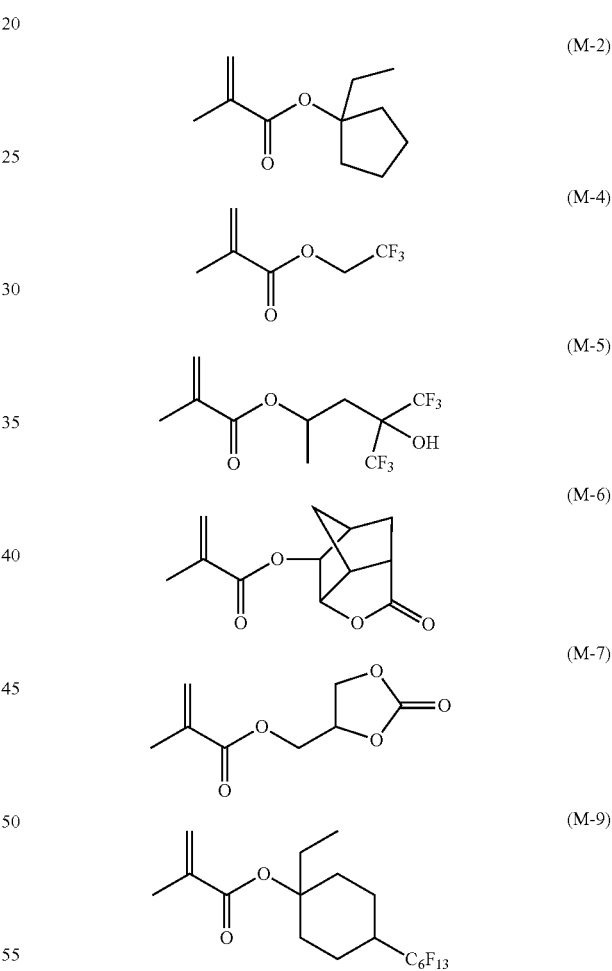

TABLE 1

|  | Polymer | Specific monomer | | Acid-labile group monomer | | Alkali-soluble group monomer | | Alkali-reactive group monomer | | Other monomer | |
| --- | --- | --- | --- | --- | --- | --- | --- | --- | --- | --- | --- |
|  |  | Type | Amount (parts) | Type | Amount (parts) | Type | Amount (parts) | Type | Amount (parts) | Type | Amount (parts) |
| Example 1 | A-1 | M-3 | 30 | M-1 | 70 | — | — | — | — | — | — |
| Example 2 | A-2 | M-3 | 40 | M-1 | 60 | — | — | — | — | — | — |
| Example 3 | A-3 | M-3 | 20 | M-1 | 80 | — | — | — | — | — | — |

TABLE 1-continued

|  | Polymer | Specific monomer | | Acid-labile group monomer | | Alkali-soluble group monomer | | Alkali-reactive group monomer | | Other monomer | |
| --- | --- | --- | --- | --- | --- | --- | --- | --- | --- | --- | --- |
|  |  | Type | Amount (parts) | Type | Amount (parts) | Type | Amount (parts) | Type | Amount (parts) | Type | Amount (parts) |
| Example 4 | A-4 | M-3 | 30 | M-2 | 70 | — | — | — | — | — | — |
| Example 5 | A-5 | M-3 | 25 | M-1 | 60 | M-5 | 15 | — | — | — | — |
| Example 6 | A-6 | M-3 | 25 | M-2 | 60 | M-5 | 15 | — | — | — | — |
| Example 7 | A-7 | M-3 | 25 | M-1 | 60 | — | — | M-6 | 15 | — | — |
| Example 8 | A-8 | M-3 | 25 | M-1 | 60 | — | — | M-7 | 15 | — | — |
| Example 9 | A-9 | M-8 | 30 | M-1 | 70 | — | — | — | — | — | — |
| Example 10 | A-10 | M-8 | 40 | M-1 | 60 | — | — | — | — | — | — |
| Example 11 | A-11 | M-8 | 20 | M-1 | 80 | — | — | — | — | — | — |
| Example 12 | A-12 | M-8 | 25 | M-1 | 60 | M-5 | 15 | — | — | — | — |
| Example 13 | A-13 | M-8 | 25 | M-1 | 60 | — | — | M-6 | 15 | — | — |
| Example 14 | A-14 | M-8 | 25 | M-1 | 60 | — | — | M-7 | 15 | — | — |
| Comparative Example 1 | A-15 | — | — | M-2 | 70 | — | — | — | — | M-4 | 30 |
| Comparative Example 2 | A-16 | — | — | M-2 | 85 | — | — | — | — | M-9 | 35 |
| Comparative Example 3 | A-17 | — | — | M-1 | 70 | — | — | — | — | M-10 | 30 |

In Table 1, "Specific monomer" indicates a monomer that produces a repeating unit having an acid-labile group which has the structure shown by the general formula (1), "Acid-labile group monomer" indicates a monomer that produces a repeating unit having an acid-labile group (repeating unit (II)), "Alkali-soluble group monomer" indicates a monomer that produces a repeating unit having an alkali-soluble group (repeating unit (III)), and "Alkali-reactive group monomer" indicates a monomer that produces a repeating unit having an alkali-reactive group (repeating unit (IV)).

TABLE 2

|  | Polymer | Monomer | Content ratio (%) | Monomer | Content ratio (%) | Monomer | Content ratio (%) | Monomer | Content ratio (%) | Mw | Mw/Mn |
| --- | --- | --- | --- | --- | --- | --- | --- | --- | --- | --- | --- |
| Example 1 | A-1 | M-3 | 29.4 | M-1 | 70.6 | — | — | — | — | 5700 | 1.4 |
| Example 2 | A-2 | M-3 | 39.9 | M-1 | 60.1 | — | — | — | — | 5500 | 1.4 |
| Example 3 | A-3 | M-3 | 19.4 | M-1 | 80.6 | — | — | — | — | 5700 | 1.4 |
| Example 4 | A-4 | M-3 | 29.5 | M-2 | 70.5 | — | — | — | — | 5500 | 1.4 |
| Example 5 | A-5 | M-3 | 25.7 | M-1 | 61.1 | M-5 | 13.2 | — | — | 4900 | 1.4 |
| Example 6 | A-6 | M-3 | 25.4 | M-2 | 61.1 | M-5 | 13.5 | — | — | 5000 | 1.5 |
| Example 7 | A-7 | M-3 | 25.5 | M-1 | 60.9 | — | — | M-6 | 13.6 | 5800 | 1.4 |
| Example 8 | A-8 | M-3 | 25.7 | M-1 | 61.2 | — | — | M-7 | 13.1 | 5700 | 1.4 |
| Example 9 | A-9 | M-8 | 30.8 | M-1 | 69.2 | — | — | — | — | 5600 | 1.4 |
| Example 10 | A-10 | M-8 | 40.1 | M-1 | 59.9 | — | — | — | — | 5600 | 1.4 |
| Example 11 | A-11 | M-8 | 20.5 | M-1 | 79.5 | — | — | — | — | 5400 | 1.4 |
| Example 12 | A-12 | M-8 | 25.2 | M-1 | 60.5 | M-5 | 14.3 | — | — | 4800 | 1.5 |
| Example 13 | A-13 | M-8 | 25.1 | M-1 | 60.8 | — | — | M-6 | 14.1 | 6000 | 1.4 |
| Example 14 | A-14 | M-8 | 25.5 | M-1 | 60.9 | — | — | M-7 | 13.6 | 6000 | 1.4 |
| Comparative Example 1 | A-15 | M-2 | 70.9 | M-4 | 29.1 | — | — | — | — | 6300 | 1.5 |
| Comparative Example 2 | A-16 | M-2 | 85.5 | M-9 | 14.5 | — | — | — | — | 5900 | 1.4 |
| Comparative Example 3 | A-17 | M-1 | 70.1 | M-10 | 29.9 | — | — | — | — | 5900 | 1.4 |
| Reference Example 1 | Polymer-1 | M-A | 39.2 | M-B | 9.2 | M-C | 41.5 | M-D | 10.1 | 5800 | 1.5 |

TABLE 3

|  | Radiation-sensitive resin composition | | | | | |
| --- | --- | --- | --- | --- | --- | --- |
|  | Type | Amount (parts) | Type | Amount (parts) | Type | Amount (parts) |
| Example 1 | Polymer-1 | 100 | A-1 | 5 | PAG1 | 12 |
| Example 2 | Polymer-1 | 100 | A-2 | 5 | PAG1 | 12 |
| Example 3 | Polymer-1 | 100 | A-3 | 5 | PAG1 | 12 |
| Example 4 | Polymer-1 | 100 | A-4 | 5 | PAG1 | 12 |
| Example 5 | Polymer-1 | 100 | A-5 | 5 | PAG1 | 12 |
| Example 6 | Polymer-1 | 100 | A-6 | 5 | PAG1 | 12 |
| Example 7 | Polymer-1 | 100 | A-7 | 5 | PAG1 | 12 |
| Example 8 | Polymer-1 | 100 | A-8 | 5 | PAG1 | 12 |
| Example 9 | Polymer-1 | 100 | A-9 | 5 | PAG1 | 12 |
| Example 10 | Polymer-1 | 100 | A-10 | 5 | PAG1 | 12 |
| Example 11 | Polymer-1 | 100 | A-11 | 5 | PAG1 | 12 |

TABLE 3-continued

| | Radiation-sensitive resin composition | | | | | |
|---|---|---|---|---|---|---|
| | Type | Amount (parts) | Type | Amount (parts) | Type | Amount (parts) |
| Example 12 | Polymer-1 | 100 | A-12 | 5 | PAG1 | 12 |
| Example 13 | Polymer-1 | 100 | A-13 | 5 | PAG1 | 12 |
| Example 14 | Polymer-1 | 100 | A-14 | 5 | PAG1 | 12 |
| Comparative Example 1 | Polymer-1 | 100 | A-15 | 5 | PAG1 | 12 |
| Comparative Example 2 | Polymer-1 | 100 | A-16 | 5 | PAG1 | 12 |
| Comparative Example 3 | Polymer-1 | 100 | A-17 | 5 | PAG1 | 12 |

TABLE 4

| | Receding contact angle | Difference between advancing contact angle and receding contact angle | Developer contact angle | Blob defects | Hydrodynamic radius ($R_H/nm^{-2}$) |
|---|---|---|---|---|---|
| Example 1 | 75° or more | A | A | Acceptable | 70 |
| Example 2 | 75° or more | A | A | Acceptable | 65 |
| Example 3 | 75° or more | A | A | Acceptable | 63 |
| Example 4 | 75° or more | A | A | Acceptable | 72 |
| Example 5 | 75° or more | B | A | Acceptable | 74 |
| Example 6 | 75° or more | B | A | Acceptable | 73 |
| Example 7 | 75° or more | B | A | Acceptable | 60 |
| Example 8 | 75° or more | B | A | Acceptable | 75 |
| Example 9 | 75° or more | A | A | Acceptable | 68 |
| Example 10 | 75° or more | A | A | Acceptable | 66 |
| Example 11 | 75° or more | A | A | Acceptable | 74 |
| Example 12 | 75° or more | B | A | Acceptable | 80 |
| Example 13 | 75° or more | B | A | Acceptable | 75 |
| Example 14 | 75° or more | B | A | Acceptable | 71 |
| Comparative Example 1 | 75° or more | A | C | Unacceptable | 251 |
| Comparative Example 2 | 75° or more | B | B | Unacceptable | 238 |
| Comparative Example 3 | 75° or more | B | C | Unacceptable | 233 |

Example 9

1-Ethyl-4,4-difluorocyclohexyl methacrylate (compound shown by the following formula (M-8)) was synthesized by the following method.

The inside of a reactor was sufficiently dried by vacuum heating, and the atmosphere inside the reactor was replaced with dry nitrogen. The reactor was charged with 2000 ml of dichloromethane and 128.4 ml (1.5 mol) of oxalyl chloride at −78° C. After the dropwise addition of 233 ml (3.0 mol) of DMSO, the mixture was stirred at −78° C. After 10 minutes had elapsed, a dichloromethane (300 ml) solution of 136.1 g (1.0 mol) of 4,4-difluorocyclohexanol was added dropwise to the mixture using a syringe over 10 minutes. After stirring the reaction mixture at −78° C. for 40 minutes and at −45° C. for 40 minutes, N,N-diisopropylethylamine (500 ml) was added to the reaction mixture. After stirring the mixture at 0° C. for 20 minutes, a saturated ammonium chloride aqueous solution (1000 ml) was added to the mixture to terminate the reaction. The mixture was then extracted three times with dichloromethane (3000 ml). The organic layer was washed with 1N hydrochloric acid and a saturated salt solution, and dried over magnesium sulfate. After removing anhydrous magnesium sulfate using a Buchner funnel, the solvent was evaporated. The residue was distilled under reduced pressure (30 mmHg) to obtain 4,4-difluorocyclohexanone (118.9 g (yield: 85%)).

The inside of a reactor was sufficiently dried by vacuum heating, and the atmosphere inside the reactor was replaced with dry nitrogen. The reactor was charged with a Grignard reagent that was prepared in 350 ml of dehydrated THF using 9.7 g (0.40 mol) of a magnesium powder and 38.9 g (0.36 mol) of bromoethane 50 ml of a dehydrated THF solution of 40.2 g (0.30 mol) of 4,4-difluorocyclohexanone was added to the reactor over 15 minutes with stirring while cooling the solution at −5° C. using an ice bath. After increasing the temperature of the reactor to room temperature, the mixture was stirred for 2 hours. 500 ml of ice water and 100 ml of ice-cooled diluted sulfuric acid were then added to the mixture while sufficiently stirring the mixture. After separating the THF layer, the aqueous layer was extracted with diethyl ether to obtain an extract. The extract was combined with the THF layer, sequentially washed with a 5% sodium carbonate aqueous solution and water, and dried over sodium sulfate. After removing sodium sulfate using a Buchner funnel, the organic solvent was evaporated. The residue was distilled under reduced pressure (30 mmHg) to obtain 1-ethyl-4-trifluoromethylcyclohexanol (32.0 g (yield: 65%)).

A four-necked flask equipped with a stirrer, a thermometer, and a dropping funnel was charged with 6.6 g (0.04 mol) of 1-ethyl-4,4-difluorocyclohexanol, 0.2 g of 4-dimethylaminopyridine, 4.9 g of triethylamine, and 20 g of acetone. The mixture was stirred to obtain a solution. A solution prepared by dissolving 4.6 g (0.044 mol) of methacrylic acid chloride in 5 g of acetone was added to the solution at 4° C. over 30 minutes. The mixture was stirred at 4° C. for 3 hours to obtain a reaction mixture. The reaction mixture was washed with water to obtain 7.42 g of 1-ethyl-4,4-difluorocyclohexyl methacrylate (hereinafter may be referred to as "compound (M-8)" ((M-8) in Table 1)). The yield of 1-ethyl-4,4-difluorocyclohexyl methacrylate with respect to 1-ethyl-4,4-difluorocyclohexanol was 78%.

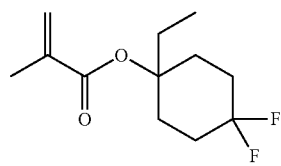

(M-8)

The $^1$H-NMR data for 1-ethyl-4,4-difluorocyclohexyl methacrylate obtained in Example 9 is shown below.

$^1$H-NMR (CDCl$_3$) δ: 0.90 (s, 3H, C—CH$_3$), δ: 1.5-1.75 (m, 6H, CH$_2$), δ: 1.95 (s, 3H, =C—CH$_3$), δ: 2.25 (s, 4H, CH$_2$), 5.71 (s, 1H, C=CH$_2$), 6.18 (s, 1H, C=CH$_2$).

A polymer (A) (polymer (A-9)) was synthesized in the same manner as in Example 1, except for using the compound (M-8) shown by the formula (M-8). In Tables 1 and 2, the polymer (A) synthesized in Example 9 is indicated by "A-9".

The polymer (A-9) had an Mw of 5600 and a dispersity (Mw/Mn) of 1.4. The content ratio (mol %) of repeating units derived from the compound (M-1) to the content ratio (mol %) of repeating units derived from the compound (M-8) determined by gas chromatography was 69.2/30.8. In Tables 1 and 2, the polymer (A) is indicated by "A-1".

A composition solution (radiation-sensitive resin composition) of Example 9 was prepared in the same manner as in Example 1, except for using the polymer (A-9) in the amount shown in Table 3. The composition solution was evaluated in the same manner as in Example 1. The evaluation results are shown in Table 4.

Examples 10 to 14 and Comparative Examples 1 and 2

A composition solution (radiation-sensitive resin composition) of each of Examples 10 to 14 and Comparative Examples 1 and 2 was prepared in the same manner as in Example 9, except for using the compound shown in Table 3 in the amount shown in Table 3. Each composition solution was evaluated in the same manner as in Example 1. The evaluation results are shown in Table 2. In Table 3, "A-10" to "A-10" respectively indicate polymers (A-10) to (A-16). The polymers (A-10) to (A-16) were obtained by reacting the monomers shown in Table 1 in the amounts shown in Table 1. Table 2 shows the type and the content ratio (mol %) of each repeating unit included in the polymers (A-10) to (A-16).

Comparative Example 3

7,7,7-Trifluoro-3-ethyl-3-heptanol (compound shown by the following formula (M-10)) was synthesized by the following method.

The inside of a reactor was sufficiently dried by vacuum heating. The reactor was charged with 1.3 g of magnesium, 10.0 g of 1-bromo-4,4,4-trifluorobutane, and 20 g of tetrahydrofuran, and a Grignard reagent was prepared by a normal method. After the dropwise addition of a mixture of 5.0 g of 3-pentanone and 4 g of tetrahydrofuran to the Grignard reagent at 25 to 35° C. over 30 minutes, the mixture was stirred at 25 to 35° C. to obtain a reaction mixture. The reaction mixture was treated by a normal method, and the organic layer was washed with water. The organic layer was dried over anhydrous magnesium sulfate, and concentrated under reduced pressure to obtain 7.9 g of a light yellow oily product (compound shown by the formula (M-10) (7,7,7-trifluoro-3-ethyl-3-heptanol)).

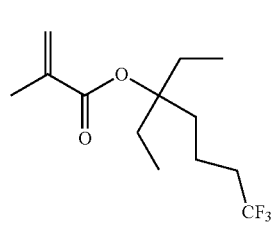

(M-10)

7,7,7-Trifluoro-3-ethyl-3-heptyl methacrylate was synthesized by the following method. The inside of a reactor was sufficiently dried by vacuum heating. The reactor was charged with 7.9 g of 7,7,7-trifluoro-3-ethyl-3-heptanol, 0.2 g of 4-dimethylaminopyridine, 7.1 g of triethylamine, and 10 g of acetonitrile. The mixture was stirred to obtain a solution. After the dropwise addition of 6.7 g of methacrylic acid chloride to the solution at about 75° C. over 30 minutes, the mixture was stirred at about 75° C. for 2 hours to obtain a reaction mixture. The reaction mixture was cooled to room temperature, washed once with a mixture of 8.8 g of potassium carbonate and 100 ml of water, and then washed once with a 10% salt solution. The reaction mixture was dried over anhydrous magnesium sulfate, and concentrated under reduced pressure to obtain a concentrate. The concentrate was purified by silica gel column chromatography to obtain 5.7 g of 7,7,7-trifluoro-3-ethyl-3-heptyl methacrylate (polymer (A-17)). In Tables 1 to 3, the polymer (A) synthesized in Comparative Example 3 is indicated by "A-17".

The $^1$H-NMR data for 7,7,7-trifluoro-3-ethyl-3-heptyl methacrylate obtained in Comparative Example 3 is shown below.

$^1$H-NMR (CDCl$_3$) δ: 0.82-0.87 (tr, 6H, —CH$_3$), 1.46-1.58 (m, 2H, —CH$_2$—), 1.78-1.97 (m, 9H, =C—CH$_3$, —C—CH$_2$—), 1.98-2.16 (m, 2H, CF$_3$CH$_2$—), 5.49 (s, 1H, C=CH$_2$), 6.01 (s, 1H, C=CH$_2$)

A composition solution (radiation-sensitive resin composition) of Comparative Example 3 was prepared in the same manner as in Example 1, except for using the polymer (A-17) in the amount shown in Table 3. The composition solution was evaluated in the same manner as in Example 1. The evaluation results are shown in Table 4.

As is clear from Table 4, it was confirmed that the radiation-sensitive resin compositions of Examples 1 to 14 can be used as a material for a resist film that has a high receding contact angle with an immersion exposure liquid (e.g., water), has an advancing contact angle and a receding contact angle in a well-balanced manner, and rarely produces development defects (particularly blob defects).

When using the radiation-sensitive resin compositions of Comparative Examples 1 to 3, the resulting resist film had a high receding contact angle (75° or more) with an immersion exposure liquid, but produced blob defects, and did not have an advancing contact angle and a receding contact angle in a well-balanced manner since the radiation-sensitive resin compositions of Comparative Examples 1 to 3 did not contain a polymer that falls under the polymer (A).

When using the radiation-sensitive resin compositions of Examples 1 to 4 and 9 to 11, the evaluation result for the difference ($\Delta_2$) between the advancing contact angle and the receding contact angle was particularly good ("A") as compared with the radiation-sensitive resin compositions of Examples 5 to 8 and 12 to 14 since the polymer (A) did not include a structural unit that includes a hydrophilic group (e.g., hydroxyl group and lactone group).

The radiation-sensitive resin composition according to the embodiments of the invention may suitably be used as a material for forming a resist film that is used for microfabrication employed in a lithographic process that utilizes EB, EUV, or X-rays (particularly production of semiconductor devices), and may be very useful as a material that can form a chemically-amplified resist used for production of semiconductor devices that are expected to be further miniaturized in the future. The method for forming a resist pattern according to the embodiments of the invention may be used for microfabrication employed in a lithographic process that utilizes EB, EUV, or X-rays (particularly production of semiconductor devices). The polymer according to the embodiments of the invention may be used as a material for the radiation-sensitive resin composition. The compound according to the embodiments of the invention may be used as a raw material for the polymer.

Obviously, numerous modifications and variations of the present invention are possible in light of the above teachings. It is therefore to be understood that within the scope of the appended claims, the invention may be practiced otherwise than as specifically described herein.

The invention claimed is:

1. A radiation-sensitive resin composition comprising:
    a first polymer which includes a repeating unit having an acid-labile group and which becomes alkali-soluble upon dissociation of the acid-labile group; and
    a radiation-sensitive acid-generating agent, wherein the acid-labile group has a structure shown by a general formula (1),

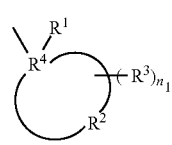

(1)

wherein $R^1$ represents a monovalent hydrocarbon group having 1 to 5 carbon atoms, $R^2$ represents a divalent hydrocarbon group that is bonded to $R^4$ to form a cyclic structure, the cyclic structure formed by $R^2$ and $R^4$ is a cyclopentyl group, a cyclohexyl group or a 2-adamantyl group, $R^3$ represents a fluorine atom or a trifluoromethyl group, the structure shown by the general formula (1) includes 7 or less fluorine atoms in total, $R^4$ represents a carbon atom, $n_1$ is an integer from 1 to 4, and a fluorine atom is not bonded to a carbon atom of the divalent hydrocarbon group represented by $R^2$ that is adjacent to the carbon atom represented by $R^4$.

2. The radiation-sensitive resin composition according to claim 1, wherein the repeating unit having the acid-labile group is a repeating unit shown by a general formula (Ia),

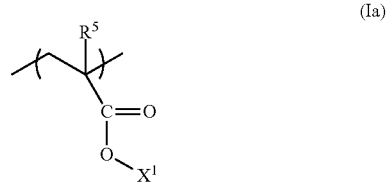

(Ia)

wherein $R^5$ represents a hydrogen atom, a methyl group, or a trifluoromethyl group, and $X^1$ represents the structure shown by the general formula (1).

3. A method for forming a resist pattern comprising:
    forming a resist film on a substrate using the radiation-sensitive resin composition according to claim 2;
    exposing the resist film via an immersion liquid provided over the resist film; and
    developing the exposed resist film to form a resist pattern.

4. The radiation-sensitive resin composition according to claim 1, further comprising a second polymer that includes a repeating unit having an acid-labile group, and differs from the first polymer.

5. The radiation-sensitive resin composition according to claim 4, wherein the amount of the first polymer is 0.1 to 20 parts by mass based on 100 parts by mass of the second polymer.

6. A method for forming a resist pattern comprising:
    forming a resist film on a substrate using the radiation-sensitive resin composition according to claim 1;
    exposing the resist film via an immersion liquid provided over the resist film; and
    developing the exposed resist film to form a resist pattern.

7. A compound shown by a general formula (2),

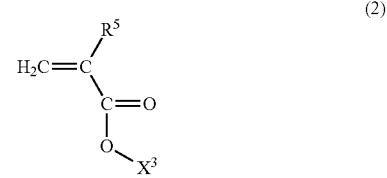

(2)

wherein $R^5$ represents a hydrogen atom, a methyl group, or a trifluoromethyl group, and $X^3$ represents a structure shown by a general formula (1),

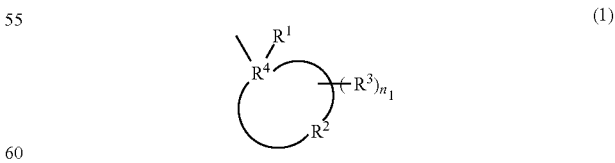

(1)

wherein $R^1$ represents a monovalent hydrocarbon group having 1 to 5 carbon atoms, $R^2$ represents a divalent hydrocarbon group that is bonded to $R^4$ to form a cyclic structure, the cyclic structure formed by $R^2$ and $R^4$ is a cyclopentyl group, a cyclohexyl group or a 2-adamantyl group, $R^3$ represents a fluorine atom or a trifluoromethyl group, and the structure shown by the general formula (1) includes 7 or less fluorine atoms in total, $R^4$ represents a carbon atom, $n_1$ is an integer from 1 to 4, and a fluorine atom is not bonded to a carbon atom of the divalent hydrocarbon group represented by $R^2$ that is adjacent to the carbon atom represented by $R^4$.

8. A polymer comprising a repeating unit derived from the compound according to claim 7.

* * * * *